(12) United States Patent
Costello

(10) Patent No.: US 11,129,290 B2
(45) Date of Patent: Sep. 21, 2021

(54) POWER DELIVERY MODULE FOR AN ELECTRONIC PACKAGE

(71) Applicant: TE CONNECTIVITY CORPORATION, Berwyn, PA (US)

(72) Inventor: Brian Patrick Costello, Scotts Valley, CA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 51 days.

(21) Appl. No.: 16/416,720

(22) Filed: May 20, 2019

(65) Prior Publication Data
US 2020/0375053 A1     Nov. 26, 2020

(51) Int. Cl.
*H05K 7/10*     (2006.01)
*G06F 1/18*     (2006.01)
*H05K 3/30*     (2006.01)
*H01R 13/24*    (2006.01)

(52) U.S. Cl.
CPC .......... *H05K 7/1084* (2013.01); *G06F 1/182* (2013.01); *G06F 1/189* (2013.01); *H01R 13/24* (2013.01); *H05K 3/301* (2013.01); *H05K 7/1092* (2013.01); *H05K 2201/10189* (2013.01); *H05K 2201/10318* (2013.01); *H05K 2201/10325* (2013.01); *H05K 2201/10719* (2013.01); *H05K 2201/10734* (2013.01); *H05K 2201/2018* (2013.01)

(58) Field of Classification Search
CPC ........ H01R 13/20; H01R 13/24; H05K 3/301; H05K 7/023; H05K 7/026; H05K 7/10; H05K 7/1084; H05K 7/1092; G06F 1/182; G06F 1/189
See application file for complete search history.

(56) References Cited

U.S. PATENT DOCUMENTS

| | | | | |
|---|---|---|---|---|
| 4,620,632 A | * | 11/1986 | Alemanni | H05K 7/1084 206/560 |
| 4,744,009 A | * | 5/1988 | Grabbe | H01L 23/4985 174/536 |
| 4,953,060 A | * | 8/1990 | Lauffer | H01L 23/49827 257/713 |
| 5,221,209 A | * | 6/1993 | D'Amico | G01R 1/0483 439/66 |
| 5,266,912 A | * | 11/1993 | Kledzik | H01L 23/64 174/267 |
| 5,383,269 A | * | 1/1995 | Rathmell | H01L 25/105 257/E21.705 |

(Continued)

*Primary Examiner* — Renee S Luebke
*Assistant Examiner* — Milagros JeanCharles

(57) ABSTRACT

A power delivery module includes a frame having rails defining an opening that receives an electronic package. A bottom of the frame is mounted to a host circuit board and faces an upper surface of the electronic package. The frame is a layered structure including a power plate, a ground plate, and an insulator electrically isolating the power plate from the ground plate. The power deliver module includes module power contacts electrically connected to the power plate and extending from the bottom for electrical connection to package power contacts of the electronic package. Module ground contacts are electrically connected to the ground plate and extend from the bottom for electrical connection to package ground contacts of the electronic package. The module power contacts and the module ground contacts deliver power to the electronic package.

25 Claims, 17 Drawing Sheets

(56) References Cited

U.S. PATENT DOCUMENTS

| | | | | |
|---|---|---|---|---|
| 5,646,542 A * | 7/1997 | Zamborelli | G01R 1/0425 | 324/750.25 |
| 6,164,980 A * | 12/2000 | Goodwin | H05K 7/1061 | 439/70 |
| 6,206,705 B1 * | 3/2001 | Bolotin | H01L 25/105 | 257/704 |
| 7,341,460 B1 * | 3/2008 | McHugh | H01R 12/7047 | 439/569 |
| 9,320,147 B2 * | 4/2016 | Cho | H05K 1/183 | |
| 9,653,230 B1 * | 5/2017 | Vaughn | H01H 13/50 | |
| 10,403,992 B1 * | 9/2019 | Mason | H01R 13/2442 | |
| 2001/0032738 A1 * | 10/2001 | Dibene, II | H05K 1/144 | 174/260 |
| 2002/0162039 A1 * | 10/2002 | Kirker | H05K 1/144 | 713/330 |
| 2003/0214800 A1 * | 11/2003 | Dibene, II | G06F 1/182 | 361/803 |
| 2005/0079744 A1 * | 4/2005 | Novotny | H05K 7/1061 | 439/66 |
| 2005/0183882 A1 * | 8/2005 | Yun | H05K 3/4641 | 174/250 |
| 2005/0248024 A1 * | 11/2005 | Costello | H05K 7/1092 | 257/691 |
| 2006/0067031 A1 * | 3/2006 | Crane, Jr. | H01G 4/232 | 361/306.2 |
| 2007/0194434 A1 * | 8/2007 | Lin | H05K 1/0253 | 257/700 |
| 2008/0117593 A1 * | 5/2008 | Andric | H05K 7/1092 | 361/697 |
| 2011/0273858 A1 * | 11/2011 | Heng | H05K 7/1084 | 361/803 |
| 2011/0294312 A1 * | 12/2011 | Costello | H01R 12/79 | 439/77 |
| 2019/0148858 A1 * | 5/2019 | Mason | H05K 1/0203 | 439/67 |

\* cited by examiner

POWER DELIVERY MODULE FOR AN ELECTRONIC PACKAGE

BACKGROUND OF THE INVENTION

The subject matter herein relates generally to communication systems.

Communication systems include electronic packages connected to a host circuit board. Electronic packages require a power supply for operating the electrical component. For example, some communication systems may include an integrated circuit, such as a chip, mounted to a host circuit board. The interface between the integrated circuit and the host circuit board includes an array of contacts, such as a ball grid array or a land grid array between the integrated circuit and the host circuit board. Typically, the array of contacts includes signal contacts, the ground contacts, and power contacts to create a signal interface and a power interface between the integrated circuit and the host circuit board. The power and ground contacts defining the power circuit are typically placed in the center or core of the integrated circuit component and the signal contacts are typically placed around the periphery of the integrated circuit component. Such arrangement allows routing of the high speed signals and the power circuit through the host circuit board and the integrated circuit. However, such routing arrangement causes the signal paths to be physically longer and further away from the silicon die of the integrated circuit, which degrades signal integrity. Additionally, due to the small size of the solderballs or land grid array contacts, the amount of power that can be carried by each contact is limited. To carry more power, more contacts are needed. This increased power requirement significantly increases the size of the electronic package.

BRIEF DESCRIPTION OF THE INVENTION

In one embodiment, a power delivery module is provided. The power deliver module includes a frame that has a top and a bottom. The frame has rails that define an opening that is configured to receive an electronic package. The bottom is configured to be mounted to a host circuit board. The bottom faces an upper surface of the electronic package with the electronic package between the bottom of the frame and the host circuit board. The frame is a layered structure that includes a power plate at a power layer, a ground plate at a ground layer, and an insulator at in insulation layer between the power layer and the ground layer. The insulator electrically isolates the power plate from the ground plate. The power delivery module includes module power contacts that are electrically connected to the power plate. The module power contacts are coupled to the rails to surround the opening and extend from the bottom for electrical connection to package power contacts of the electronic package. Module ground contacts are electrically connected to the ground plate. The module ground contacts are coupled to the rails to surround the opening and extend from the bottom for electrical connection to package ground contacts of the electronic package. The module power contacts and the module ground contacts deliver power to the electronic package.

In another embodiment, a power delivery module is provided. The power deliver module includes a frame that has a top and a bottom. The frame has rails that define an opening that is configured to receive an electronic package. The frame includes at least one mounting pad coupled to a host circuit board. The at least one mounting pad includes module terminals electrically connected to the host circuit board to receive a power supply from the host circuit board. The bottom faces an upper surface of the electronic package with the electronic package between the bottom of the frame and the host circuit board. The frame is a layered structure that includes a power plate at a power layer, a ground plate at a ground layer, and an insulator at in insulation layer between the power layer and the ground layer. The insulator electrically isolates the power plate from the ground plate. The power plate and the ground plate are electrically connected to corresponding module terminals for receiving the power supply. The power deliver module includes module power contacts that are electrically connected to the power plate. The module power contacts are coupled to the rails to surround the opening and extend from the bottom for electrical connection to package power contacts of the electronic package. Module ground contacts are electrically connected to the ground plate. The module ground contacts are coupled to the rails to surround the opening and extend from the bottom for electrical connection to package ground contacts of the electronic package. The module power contacts and the module ground contacts deliver the power supply to the electronic package.

In a further embodiment, a communication system is provided. The communication system includes an electronic package that includes a package substrate having an upper surface and a lower surface. The lower surface is configured to be mounted to a host circuit board. The package substrate has package signal contacts that are configured to be terminated to host circuit board signal conductors of the host circuit board. The package substrate has package power contacts that are configured to be terminated to host circuit board power conductors of the host circuit board. The package substrate has package ground contacts that are configured to be terminated to host circuit board ground conductors of the host circuit board. The electronic package includes an integrated circuit component mounted to the upper surface of the package substrate. The integrated circuit component is electrically connected to the package signal contacts, the package power contacts and the package ground contacts. The communication system includes a power delivery module that is configured to be mounted to the host circuit board and is powered by the host circuit board. The power delivery module is coupled to the electronic package to deliver a power supply to the electronic package. The power delivery module comprises a frame. Module power contacts are coupled to the frame and module ground contacts coupled to the frame. The frame has a top and a bottom. The frame has rails that define an opening receiving the integrated circuit component. The bottom is configured to be mounted to the host circuit board. The bottom faces the upper surface of the package substrate with the package substrate between the bottom of the frame and the host circuit board. The frame is a layered structure that includes a power plate at a power layer, a ground plate at a ground layer, and an insulator at in insulation layer between the power layer and the ground layer. The insulator electrically isolates the power plate from the ground plate. The module power contacts are electrically connected to the power plate. The module power contacts are coupled to the rails to surround the opening and extend from the bottom for electrical connection to corresponding package power contacts. The module ground contacts are electrically connected to the ground plate. The module ground contacts are coupled to the rails to surround the opening and extend from the bottom for electrical connection to corresponding package ground contacts of the electronic package. The module power contacts and the module ground contacts deliver the power supply to the electronic package.

DETAILED DESCRIPTION OF THE INVENTION

Figure 1:
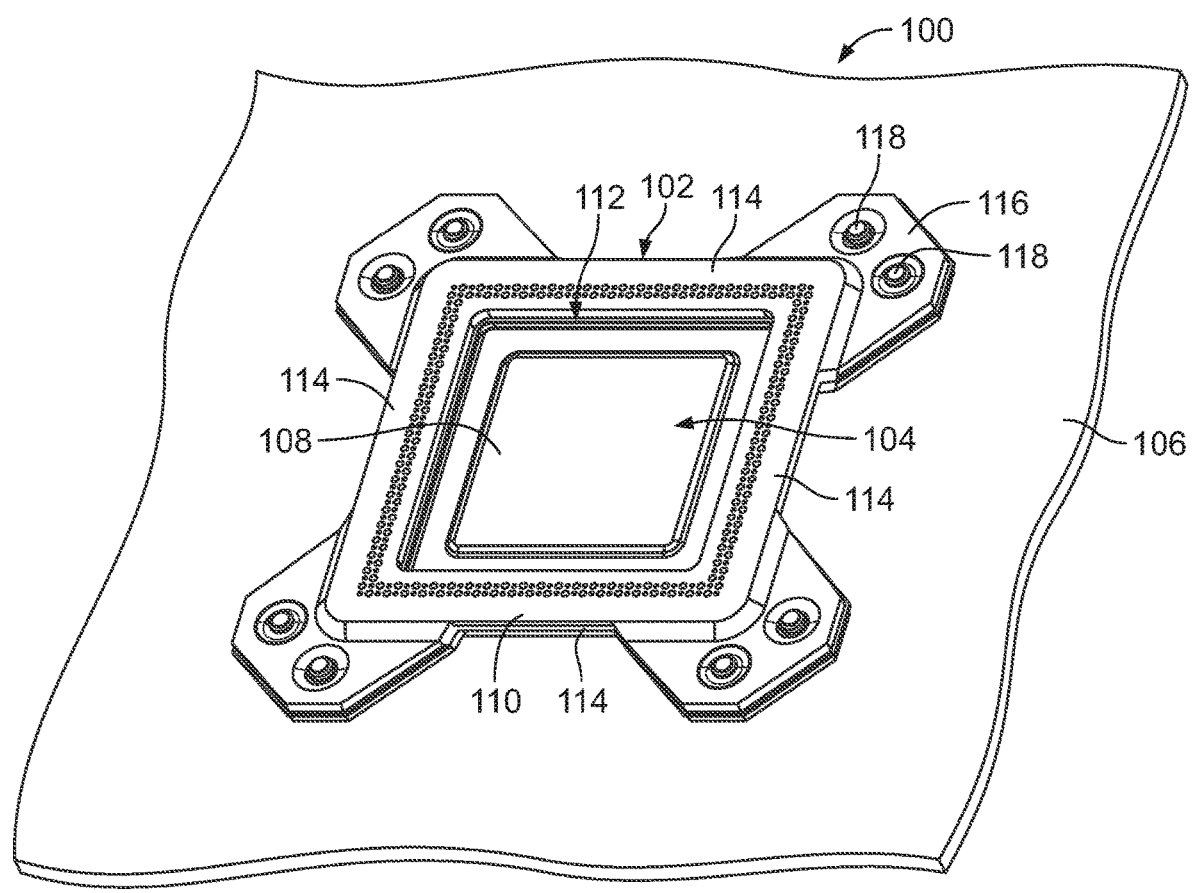
FIG. 1 is a top perspective view of a communication system having a power delivery module in accordance with an exemplary embodiment.

FIG. 1 is a top perspective view of a communication system 100 having a power delivery module 102 in accordance with an exemplary embodiment. The power delivery module 102 is used to supply power to an electronic package 104. The electronic package 104 and the power delivery module 102 are mounted to a host circuit board 106. The power delivery module 102 is electrically connected to the host circuit board 106 and receives a power supply from the host circuit board 106. The power delivery module 102 delivers the power supply to the electronic package 104.

In an exemplary embodiment, the power delivery module 102 is electrically connected to a top side of the electronic package 104. The bottom side of the electronic package 104 is mounted to the host circuit board 106. In an exemplary embodiment, the power delivery module 102 includes a frame 110 having an opening 112. The opening 112 provides access to the electronic package 104 for connection with a heat sink or other component, such as a cold plate. Optionally, a portion of the electronic package 104 is received in the opening 112. For example, in various embodiments, the electronic package 104 includes an integrated circuit component 108, such as a chip, a silicon die(s), passive components such as capacitors, and the like. The integrated circuit component is provided on a base substrate. Optionally, a cover or lid may be provided over the integrated circuit component 108. The integrated circuit component 108 is received in the opening 112. The frame 110 includes rails 114 surrounding the opening 112. For example, the rails 114 define a perimeter around the opening 112. In various embodiments, the opening 112 is completely surrounded by the rails 114 such that the opening 112 is closed. In other various embodiments, the opening 112 may be open along one or more sides. In the illustrated embodiment, the opening 112 is rectangular and the rails 114 are provided on all four sides of the opening 112. The opening 112 may have other shapes in alternative embodiments.

In an exemplary embodiment, the frame 110 includes mounting pads 116 mounted to the host circuit board 106. In the illustrated embodiment, mounting pads 116 are provided at each of the four corners of the frame 110. Greater or fewer mounting pads 116 may be provided in alternative embodiments. The mounting pads 116 may be provided at other locations in alternative embodiments. In an exemplary embodiment, the frame 110 is mechanically and electrically connected to the host circuit board 106 using fasteners 118 secured to the mounting pads 116. In various embodiments, the fasteners 118 may be threaded fasteners.

Figure 2:
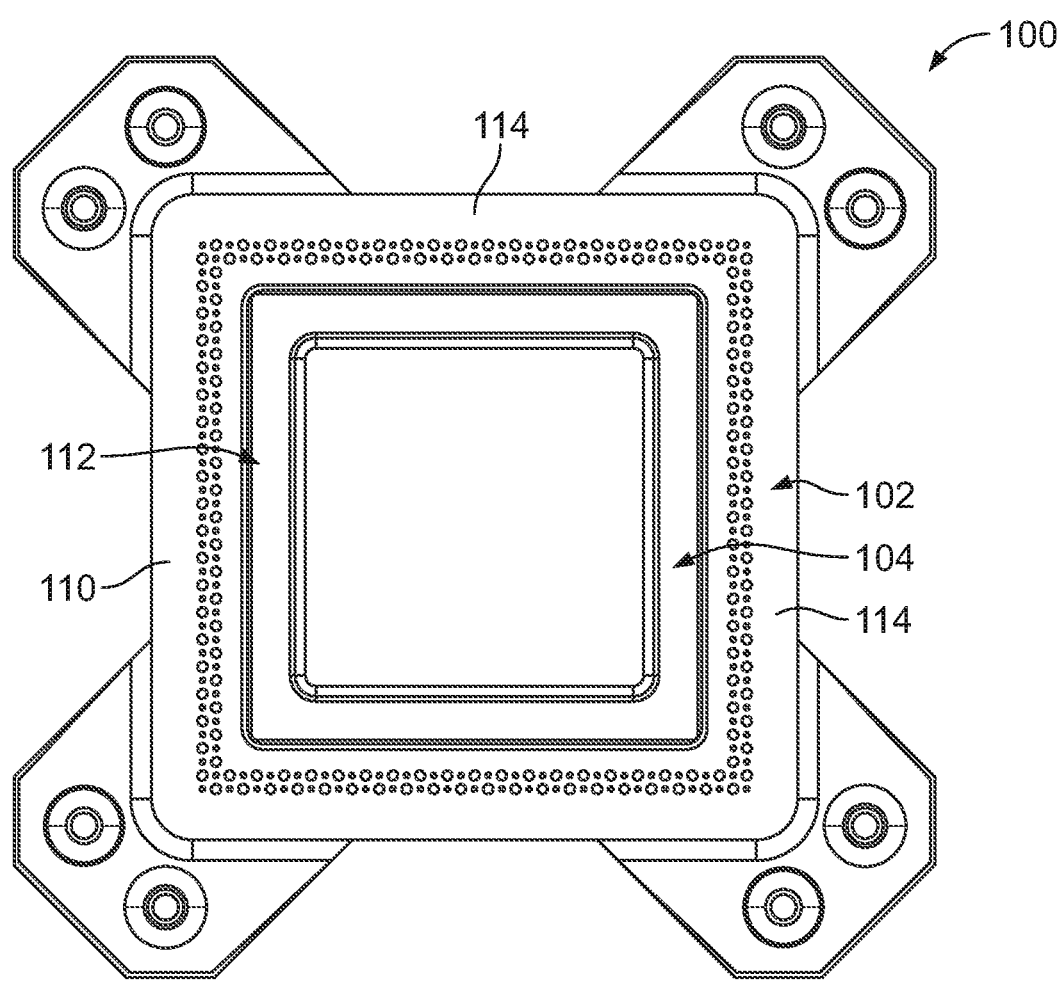
FIG. 2 is a top plan view of the communication system showing the power delivery module coupled to an electronic package in accordance with an exemplary embodiment.

FIG. 2 is a top plan view of the communication system 100 showing the power delivery module 102 coupled to the electronic package 104. In an exemplary embodiment, the opening 112 is centered within the frame 110. The frame 110 covers a portion of the electronic package 104. For example, the rails 114 are located above an outer perimeter of the electronic package 104.

Figure 3:
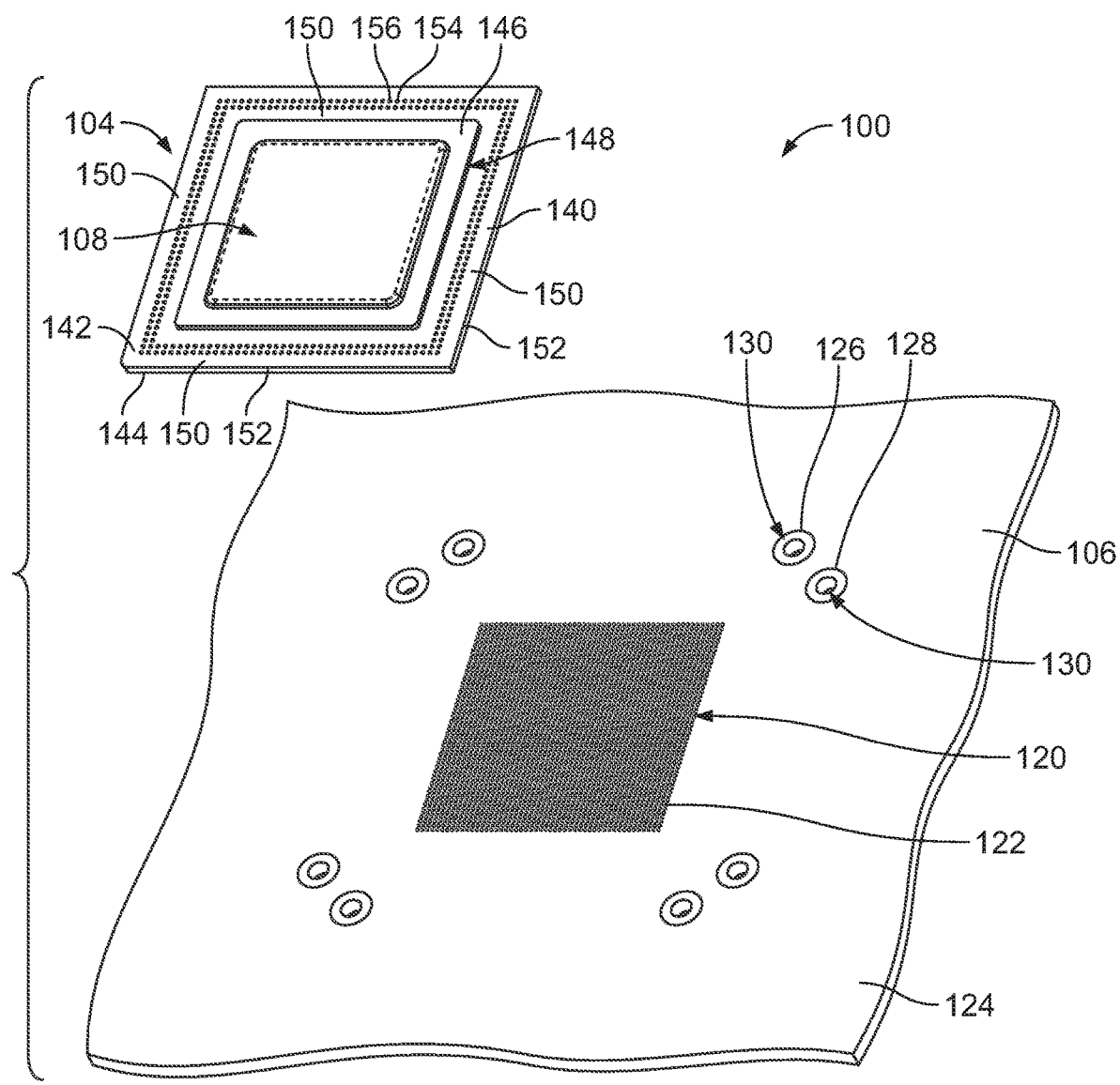
FIG. 3 is an exploded, top perspective view of a portion of the communication system showing the electronic package poised for coupling to the host circuit board in accordance with an exemplary embodiment.

FIG. 3 is an exploded, top perspective view of a portion of the communication system 100 showing the electronic package 104 poised for coupling to a mounting area 120 of the host circuit board 106. The host circuit board 106 includes an array of host circuit board contacts 122 at the mounting area 120. In various embodiments, the host circuit board contacts 122 are contact pads at an upper surface 124 of the host circuit board 106. For example, the host circuit board contacts 122 may be solder ball pads or land grid array pads. In various embodiments, the host circuit board contacts 122 may include plated vias in the host circuit board 106.

In an exemplary embodiment, the host circuit board contacts 122 include signal contacts and ground contacts. For example, the ground contacts may be arranged between and interspersed with the signal contacts, such as to provide electrical shielding between various signal contacts. Optionally, the signal contacts may be arranged in pairs with the ground contacts between corresponding pairs of signal contacts. In an exemplary embodiment, the host circuit board contacts 122 are devoid of power contacts. Rather, power is supplied to the electronic package 104 through the power delivery module 102 (shown in FIG. 1). Eliminating power contacts in the mounting area 120 may allow for tighter spacing and/or increased density of signal contacts in the mounting area 120, which may allow for a greater number of signal contacts within the mounting area 120 per unit length or may allow for connection of a smaller electronic package 104, thus reducing the size and/or the cost of the communication system 100. Eliminating power contacts in the mounting area 120 may allow for more efficient signal routing of the signal contacts within the host circuit board 106, thus shortening signal paths within the communication system 100, thereby improving signal integrity.

In an exemplary embodiment, the host circuit board 106 includes host power terminals 126 and host ground terminals 128 forming a power circuit of the host circuit board 106 (sometimes referred to hereinafter individually as host terminal or collectively as host terminals). The power circuit provides a power supply to the power delivery module 102 (shown in FIG. 1). In an exemplary embodiment, the host power terminal 126 is a cathode or positive conductor of the power circuit and the host ground terminal 128 is an anode or negative conductor of the power circuit. In various embodiments, the host circuit board 106 includes a plurality of the host power terminals 126 and a plurality of the host ground terminals 128. Optionally, the host terminals 126, 128 may be arranged in sets at different locations around an outside periphery of the mounting area 120. In the illustrated embodiment, the host terminals 126, 128 are arranged in four sets in different quadrants around the outside of the mounting area 120. Space or gaps are provided between the sets of host terminals 126, 128, such as for routing signal traces through the host circuit board 106 to the host circuit board contacts 122. In an exemplary embodiment, the host terminals 126, 128 include threaded inserts 130 received in the host circuit board 106. The threaded inserts 130 are electrically connected to the host circuit board 106. The threaded inserts 130 are configured to receive the fasteners 118 (shown in FIG. 1) to mechanically and electrically connect the power delivery module 102 to the host circuit board 106.

The electronic package 104 includes a package substrate 140 having an upper surface 142 and a lower surface 144. The lower surface 144 faces the host circuit board 106. The lower surface 144 is configured to be mounted to the host circuit board 106. The integrated circuit component 108 (shown in phantom) is provided on the upper surface 142 and a package lid 146 may extend over the top of the integrated circuit component 108. The integrated circuit component 108 may include a silicon die(s) and may include passive components such as capacitors. In various embodiments, the integrated circuit component 108 and the package lid 146 are arranged at a central area 148 of the package substrate 140. The integrated circuit component 108 is electrically connected to the package substrate 140. The integrated circuit component 108 is configured to be electrically connected to the host circuit board contacts 122 when the electronic package 104 is mounted to the host circuit board 106.

In an exemplary embodiment, the package substrate 140 includes lands 150 arranged outside of the central area 148. The lands 150 extend between the central area 148 and corresponding edges 152 of the package substrate 140. The edges 152 define a perimeter of the electronic package 104. In an exemplary embodiment, the lands 150 have sufficient width between the central area 148 and the corresponding edge 152 for mounting the power delivery module 102 to the electronic package 104. In an exemplary embodiment, the electronic package 104 includes package power contacts 154 and package ground contacts 156 configured to be electrically connected to the power delivery module 102 (sometimes referred to hereinafter individually as package contact or collectively as package contacts). The package contacts 154, 156 are arranged along the lands 150 between the integrated circuit component 108 and the edges 152 of the package substrate 140. The package contacts 154, 156 are located outside of the central area 148, such as along the periphery or border of the integrated circuit component 108 proximate to the outer perimeter of the electronic package 104. Optionally, the package contacts 154, 156 may be provided along all four sides of the integrated circuit component 108. In various embodiments, the package contacts 154, 156 are plated vias at the upper surface 142. The plated vias are configured to receive compliant pins to mechanically and electrically connect the electronic package 104 to the power delivery module 102. In other various embodiments, the package contacts 154, 156 may be contact pads on the upper surface 142, such as solder pads. In other various embodiments, the package contacts 154, 156 may be solder balls arranged in a ball grid array or spring beams arranged in a land grid array.

Figure 4:
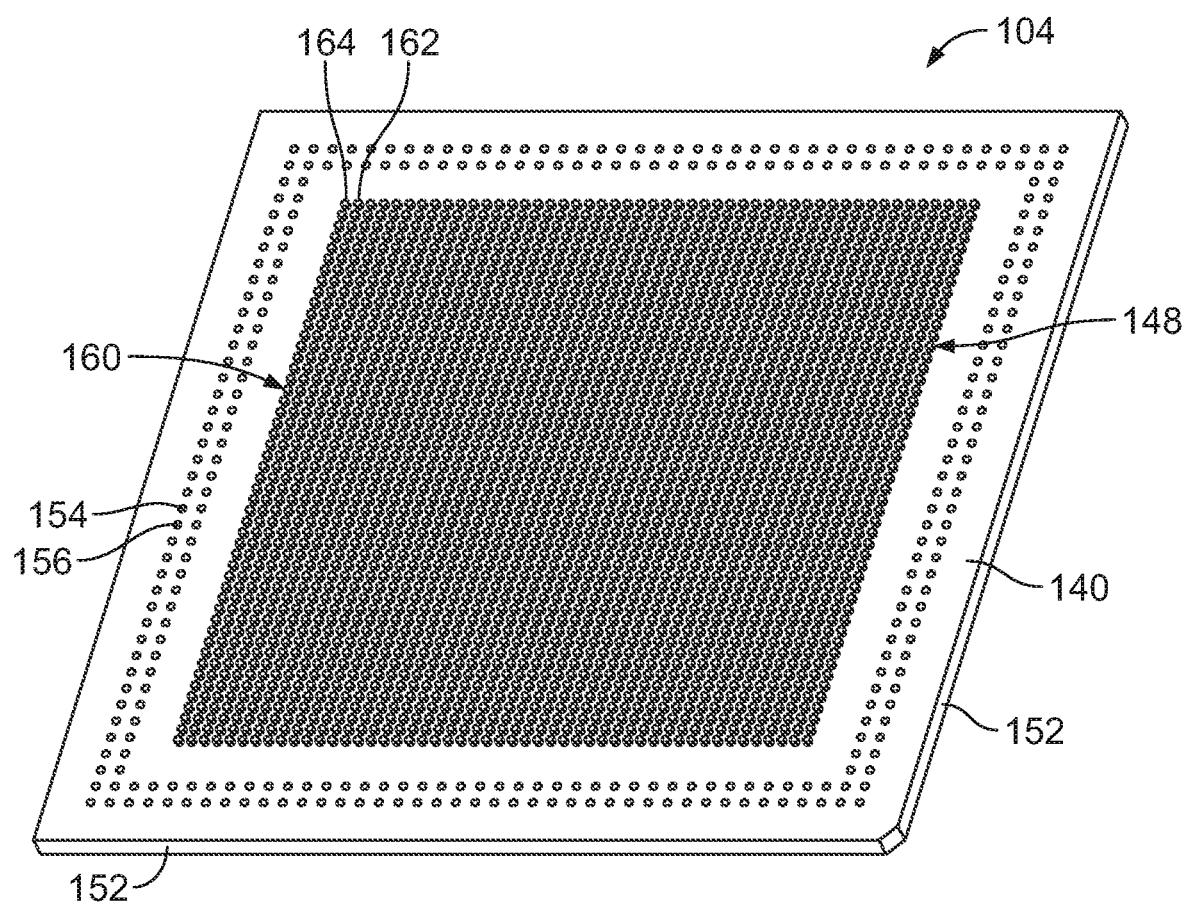
FIG. 4 is a bottom perspective view of the electronic package in accordance with an exemplary embodiment.

FIG. 4 is a bottom perspective view of the electronic package 104 in accordance with an exemplary embodiment. FIG. 4 shows the package contacts 154, 156 arranged around the outer periphery of the package substrate 140. In an exemplary embodiment, the electronic package 104 includes an array of package contacts 160 in the central area 148 of the package substrate 140. The package contacts 160 may be located immediately below the integrated circuit component 108 (shown in FIG. 3) at the central area 148.

In an exemplary embodiment, the package contacts 160 include package signal contacts 162 and package ground contacts 164. The package ground contacts 164 may be arranged between and interspersed with the package signal contacts 162, such as to provide electrical shielding between various signal contacts. Optionally, the package signal contacts 162 may be arranged in pairs with the package ground contacts 164 between corresponding pairs of the package signal contacts 162. In various embodiments, the package contacts 160 are solder balls arranged in a ball grid array.

However, the package contacts 160 may be contact pads, solder pads, plated vias, or spring beams arranged in a land grid array in other various embodiments.

In an exemplary embodiment, the package contacts 160 are devoid of power contacts. Rather, the package power contacts 154 and the package ground contacts 156 forming the power circuit of the electronic package 104 are arranged outside of central area 148 around the periphery of the package contacts 160, such as adjacent the edges 152 of the package substrate 140. Eliminating power contacts in the central area 148 may allow for tighter spacing and/or increased density of the package contacts 160 used for transmitting high speed data signals to and from the integrated circuit component 108, which may allow for a greater numbers of package signal contacts 162 or may allow for a reduction in size or footprint of the electronic package 104. Eliminating the package power contacts 154 and the package ground contacts 156 from the central area 148 may allow for more efficient signal routing to and from the integrated circuit component 108 through the package substrate 140, thereby improving signal integrity.

Figure 5:
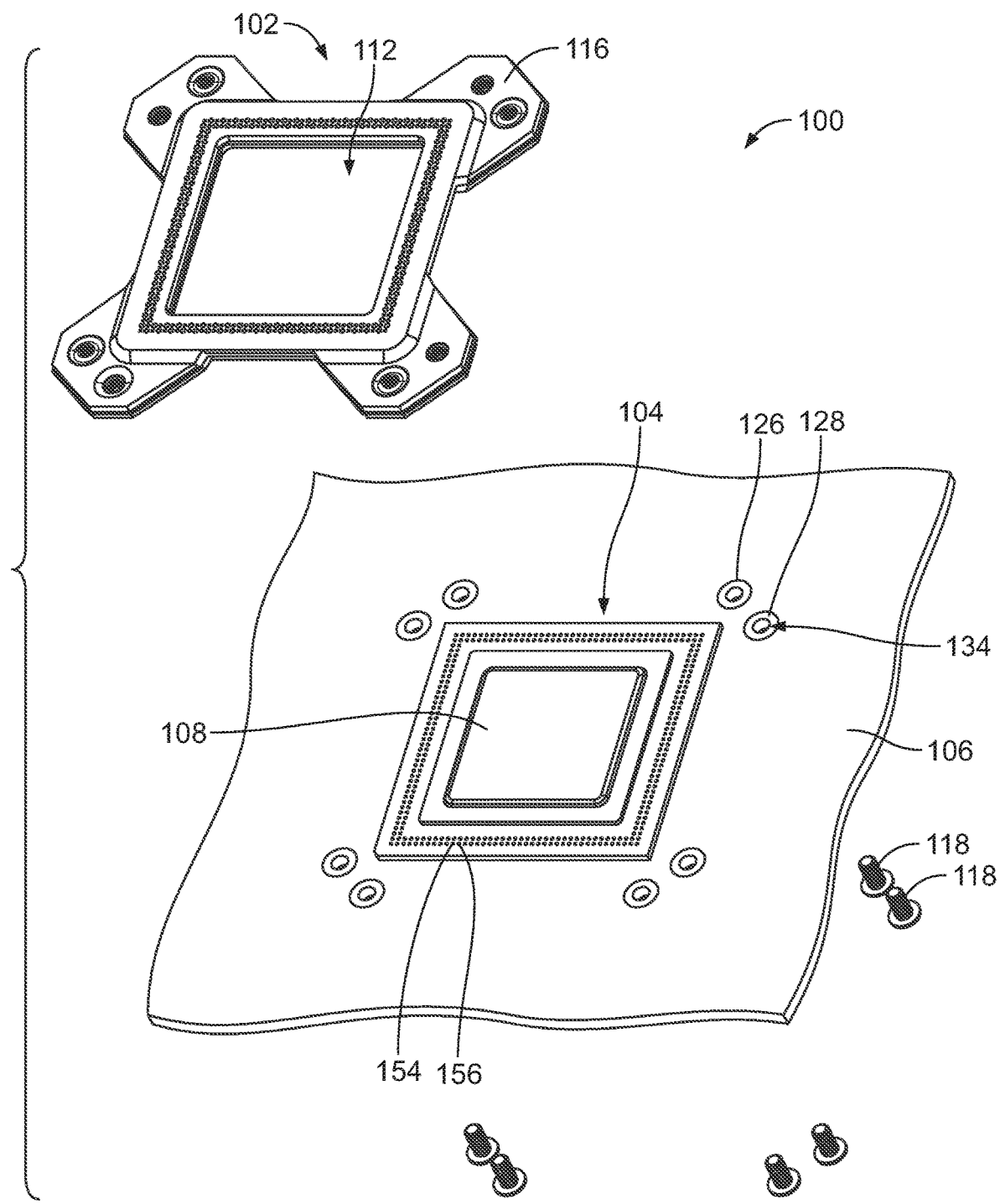
FIG. 5 is an exploded, top perspective view of the communication system in accordance with an exemplary embodiment.

FIG. 5 is an exploded, top perspective view of the communication system 100 in accordance with an exemplary embodiment showing the power delivery module 102 poised for mounting to the electronic package 104 and the host circuit board 106. In various embodiments, the electronic package 104 is mounted to the host circuit board 106 prior to mounting the power delivery module 102 to the host circuit board 106. However, in alternative embodiments, the power delivery module 102 may be mounted to the electronic package 104 prior to mounting the power delivery module 102 and the electronic package 104 to the host circuit board 106 as a unit.

During assembly, the power delivery module 102 is aligned with the electronic package 104 and lowered into position over the top side of the electronic package 104 when mounting the power delivery module 102 to the host circuit board 106. The opening 112 is aligned with the integrated circuit component 108. The mounting pads 116 are aligned with the host terminals 126, 128. The fasteners 118 are used to mechanically and electrically connect the mounting pads 116 to the host circuit board 106. For example, the fasteners 118 may pass through the threaded inserts 134 threadably coupling to the mounting pads 116. Power is supplied to the power delivery module 102 through the host terminals 126, 128. In an exemplary embodiment, the power delivery module 102 is electrically connected to the package contacts 154, 156 to deliver power to the electronic package 104.

Figure 6:
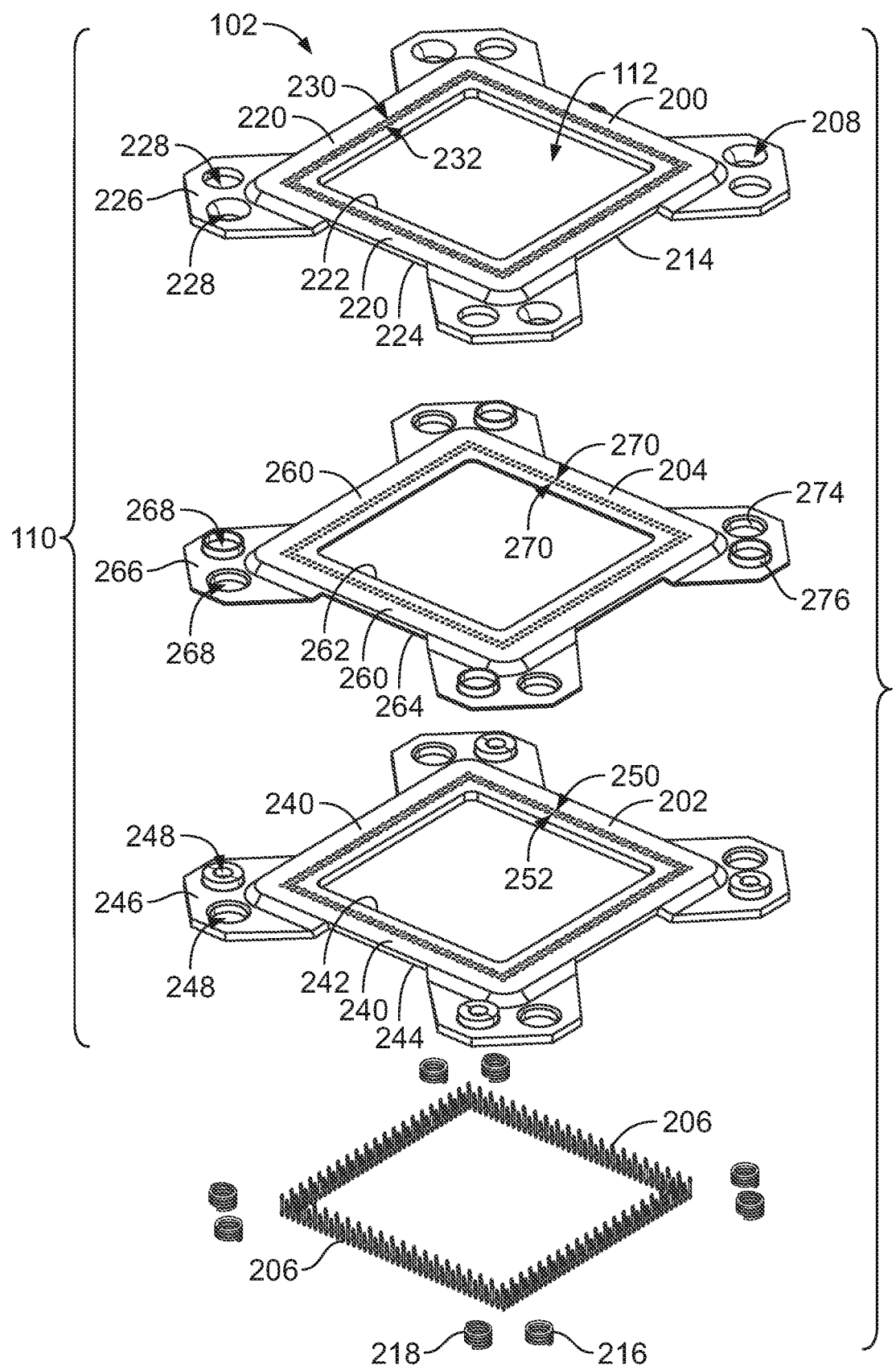
FIG. 6 is an exploded, top perspective view of the power delivery module in accordance with an exemplary embodiment.
Figure 7:
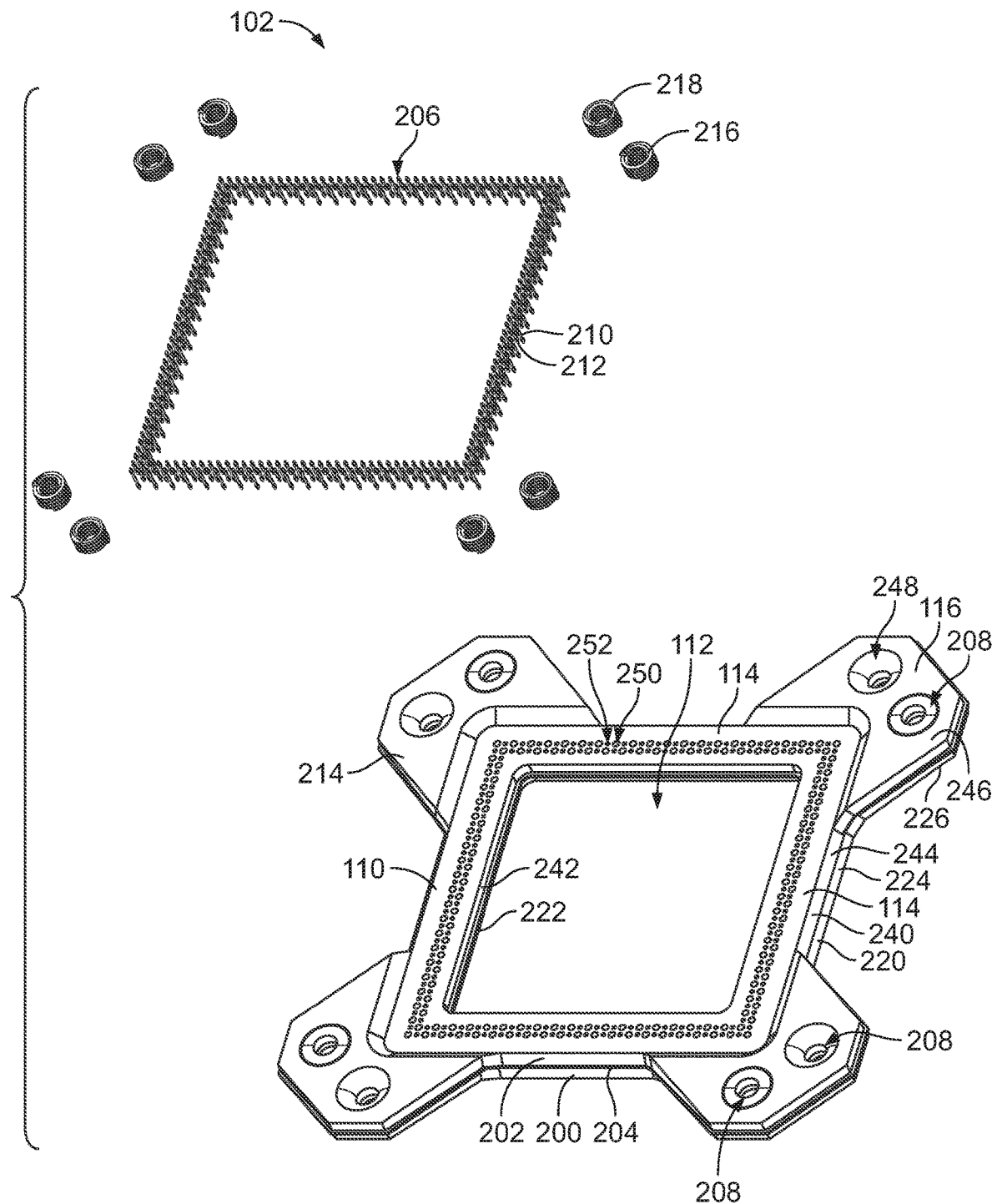
FIG. 7 is an exploded, bottom perspective view of the power delivery module in accordance with an exemplary embodiment.

FIG. 6 is an exploded, top perspective view of the power delivery module 102 in accordance with an exemplary embodiment. FIG. 7 is an exploded, bottom perspective view of the power delivery module 102 in accordance with an exemplary embodiment. In an exemplary embodiment, the frame 110 is a layered structure including a power plate 200 at a power layer, a ground plate 202 at a ground layer, and an insulator 204 at in insulation layer between the power layer and the ground layer. The insulator 204 electrically isolates the power plate 200 from the ground plate 202. In the illustrated embodiment, the power plate 200 is the top layer and the ground plate 202 is the bottom layer; however, the power plate 200 may be the bottom layer and the ground plate 202 may be the top layer in alternative embodiments.

The power delivery module 102 includes an array of module contacts 206 configured to be electrically connected to the electronic package 104 (shown in FIG. 1) and an array of module terminals 208 configured to be electrically connected to the host circuit board 106 (shown in FIG. 1). The module contacts 206 and the module terminals 208 are electrically connected to the frame 110, such as to the power plate 200 and the ground plate 202. The frame 110 defines a power bus to electrically connect the module contacts 206 and the module terminals 208.

In an exemplary embodiment, the module contacts 206 include module power contacts 210 and module ground contacts 212. The module power contacts 210 are electrically connected to the power plate 200 and the module ground contacts 212 are electrically connected to the ground plate 202. In an exemplary embodiment, the module power contacts 210 and the module ground contacts 212 are coupled to the rails 114 surrounding the opening 112 and extend from a bottom 214 of the frame 110 for electrical connection to corresponding package power contacts 154 and package ground contacts 156 (both shown in FIG. 3) of the electronic package 104. The module power contacts 210 and the module ground contacts 212 deliver power to the electronic package 104.

The module power contacts 210 and the module ground contacts 212 are stamped and formed contacts. Any number of the module power contacts 210 and/or the module ground contacts 212 may be provided in the array and may be arranged in any order, such as in an alternating sequence. In an exemplary embodiment, the module power contacts 210 and the module ground contacts 212 are compliant pins, such as eye-of-the-needle pins, configured to be press-fit into the frame 110. However, the module power contacts 210 and the module ground contacts 212 may be other types of contacts in alternative embodiments, such as solder pins, spring beams, pogo pins, and the like. In an exemplary embodiment, the module power contacts 210 and the module ground contacts 212 are compliant pins, such as eye-of-the-needle pins, configured to be press-fit into the frame 110. However, the module power contacts 210 and the module ground contacts 212 may be other types of contacts in alternative embodiments, such as solder pins, spring beams, pogo pins, and the like. In various embodiments, the module power contacts 210 and the module ground contacts 212 are double sided compliant pin contacts.

The power plate 200 may be a generally planar structure having walls 220 forming portions of the rails 114. In various embodiments, the power plate 200 is a metal plate, such as being stamped and formed, or milled or otherwise fabricated from a metal material. In other various embodiments, the power plate 200 may be a circuit board having a conductive layer forming part of the power circuit. The walls 220 surround the opening 112. Each wall 220 includes an inner edge 222 and an outer edge 224. The inner edge 222 faces the opening 112. The outer edge 224 defines an outer perimeter of the power plate 200. In an exemplary embodiment, the power plate 200 includes pad members 226, which define portions of the mounting pads 116. In the illustrated embodiment, the pad members 226 are provided in each of the four corners; however, the pad members 226 may be provided at other locations in alternative embodiments. The pad members 226 include bores 228 through the pad members 226. The bores 228 receive corresponding module terminals 208. In various embodiments, the bores 228 are threaded to mechanically and electrically connect to the fasteners 118 (shown in FIG. 1). In various embodiments, the module terminals 208 include threaded inserts 216 received in the bores 228 that threadably receive corresponding fasteners 118. The threaded inserts 216 provide structural support for the module terminals 208.

The walls 220 include connecting through holes 230 and non-connecting through holes 232. The connecting through holes 230 define power through holes and receive corresponding module power contacts 210. The module power contacts 210 are connected to the power plate 200 at the corresponding connecting through hole 230. The non-connecting through holes 232 define ground through holes and receive corresponding module ground contacts 212. The module ground contacts 212 are electrically isolated from the power plate 200 and do not engage the power plate 200 in the non-connecting through holes 232. For example, the non-connecting through holes 232 may be oversized relative to the module ground contacts 212 and/or may be filled with an insulative material to electrically isolate the module ground contacts 212 from the power plate 200 to prevent short circuiting of the power and ground layers. In other various embodiments, the module ground contacts 212 are short contacts and stop at the ground plate 202 such that the module ground contacts 212 do not extend into the power plate 200. In alternative embodiments, the power plate 200 does not include any non-connecting through holes 232 and does not receive the module ground contacts 212.

The ground plate 202 may be a generally planar structure having walls 240 forming portions of the rails 114. In various embodiments, the ground plate 202 is a metal plate, such as being stamped and formed, or milled or otherwise fabricated from a metal material. In other various embodiments, the ground plate 202 may be a circuit board having a conductive layer forming part of the power circuit. The walls 240 are configured to be aligned with the walls 220 to from the rails 114. The walls 240 surround the opening 112. Each wall 240 includes an inner edge 242 and an outer edge 244. The inner edge 242 faces the opening 112. The outer edge 244 defines an outer perimeter of the ground plate 202. In an exemplary embodiment, the ground plate 202 includes pad members 246, which define portions of the mounting pads 116. In the illustrated embodiment, the pad members 246 are provided in each of the four corners; however, the pad members 246 may be provided at other locations in alternative embodiments. The pad members 246 include bores 248 through the pad members 246. The bores 248 receive corresponding module terminals 208. In various embodiments, the bores 248 are threaded to mechanically and electrically connect to the fasteners 118 (shown in FIG. 1). In other various embodiments, the module terminals 208 include threaded inserts 218 received in the bores 248 that are electrically connected to the ground plate 202. The threaded inserts 218 threadably receive corresponding fasteners 118.

The walls 240 include connecting through holes 250 and non-connecting through holes 252. The connecting through holes 250 define ground through holes and receive corresponding module ground contacts 212. The module ground contacts 212 are connected to the ground plate 202 at the corresponding connecting through hole 250. The non-connecting through holes 252 define power through holes and receive corresponding module power contacts 210. The module power contacts 210 are electrically isolated from the ground plate 202 and do not engage the ground plate 202 in the non-connecting through holes 252. For example, the non-connecting through holes 252 may be oversized relative to the module power contacts 210 and/or may receive an insulative material to electrically isolate the module power contacts 210 from the ground plate 202 to prevent short circuiting of the power and ground layers.

The insulator 204 may be a generally planar structure having areas 260 forming portions of the rails 114. The insulator 204 may be a very thin insulating material conforming to the power plate 200 and the ground plate 202. In various embodiments, the insulator 204 is a dielectric plate or film, such as being fabricated from a plastic or other insulative material. In other various embodiments, the insulator 204 may be a circuit board. The areas 260 are configured to be aligned with the walls 220 and the walls 240 to from the rails 114. The areas 260 surround the opening 112. Each wall 260 includes an inner edge 262 and an outer edge 264. The inner edge 262 faces the opening 112. The outer edge 264 defines an outer perimeter of the insulator 204. The areas 260 include through holes 270 configured to be aligned with the through holes 230, 232 of the power plate 200 and the through holes 250, 252 of the ground plate 202. In various embodiments, the insulator 204 may be fabricated from a dielectric material intended to increase the capacitance of the power delivery module 102, thus improving the electrical performance by lowering the inductance.

In an exemplary embodiment, the insulator 204 includes pad members 266, which define portions of the mounting pads 116. In the illustrated embodiment, the pad members 266 are provided in each of the four corners; however, the pad members 266 may be provided at other locations in alternative embodiments. The pad members 266 include bores 268 through the pad members 266. The bores 268 receive corresponding module terminals 208. In an exemplary embodiment, the pad members 266 include separating walls 274, 276 surrounding the bores 268. The separating walls 274 are configured to extend into the bores 228 of the power plate 200 to electrically isolate the power plate from the ground plate 202 and/or the threaded inserts 218 received in the bores 248 of the ground plate 202. The separating walls 276 are configured to extend into the bores 248 of the ground plate 202 to electrically isolate the ground plate 202 from the power plate 200 and/or the threaded inserts 216 received in the bores 228 of the power plate 200.

Figure 8:
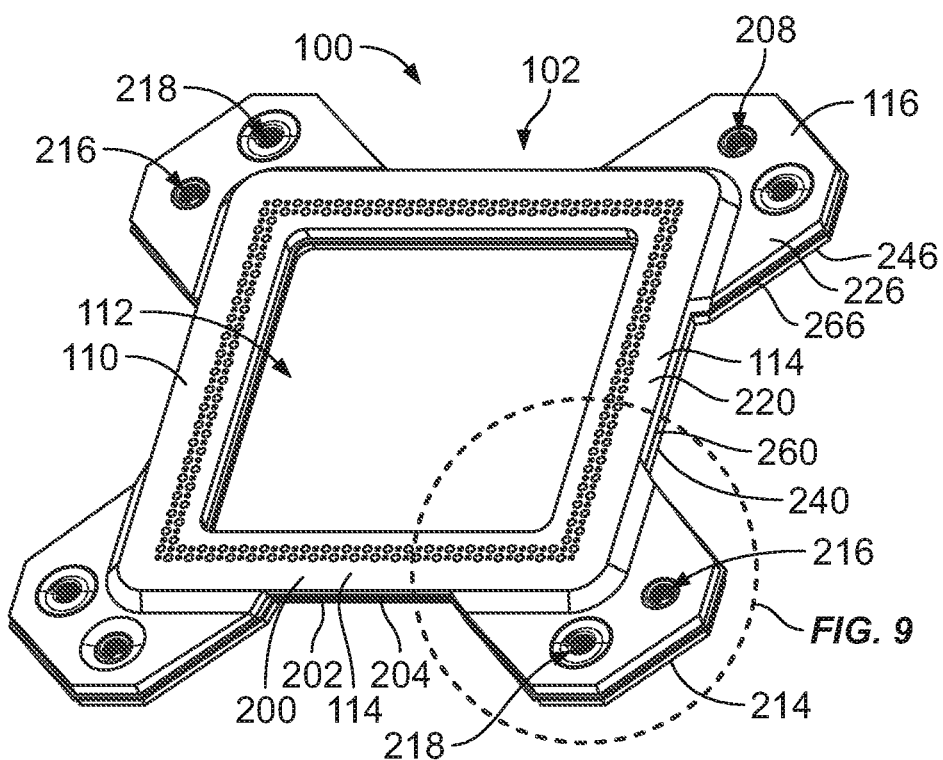
FIG. 8 is a top perspective view of the power delivery module in accordance with an exemplary embodiment.
Figure 9:
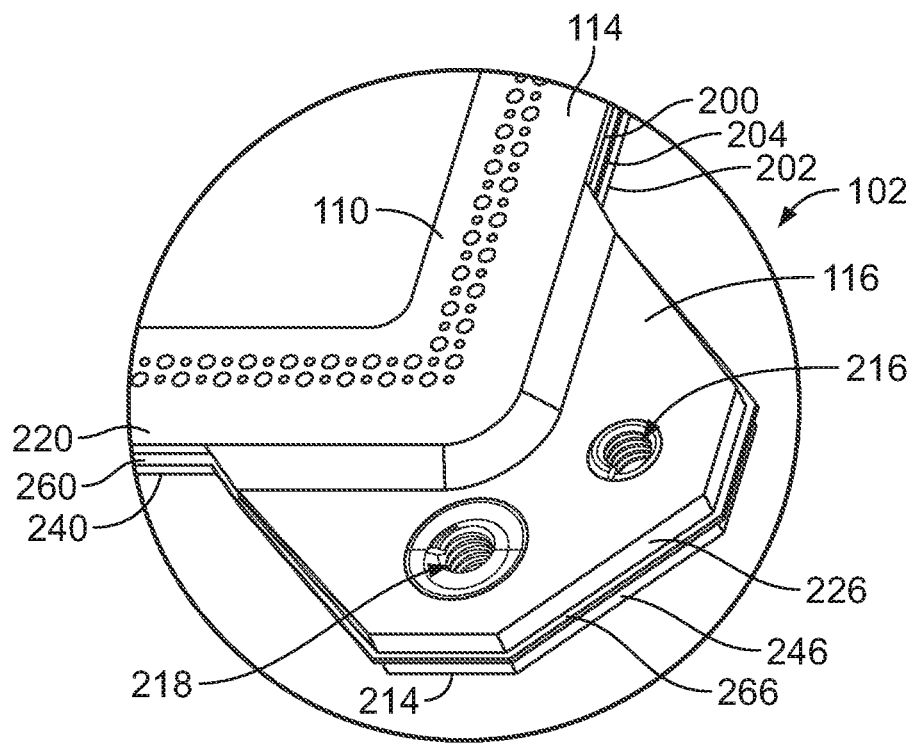
FIG. 9 is an enlarged view of a portion of the power delivery module shown in FIG. 8 in accordance with an exemplary embodiment.
Figure 10:
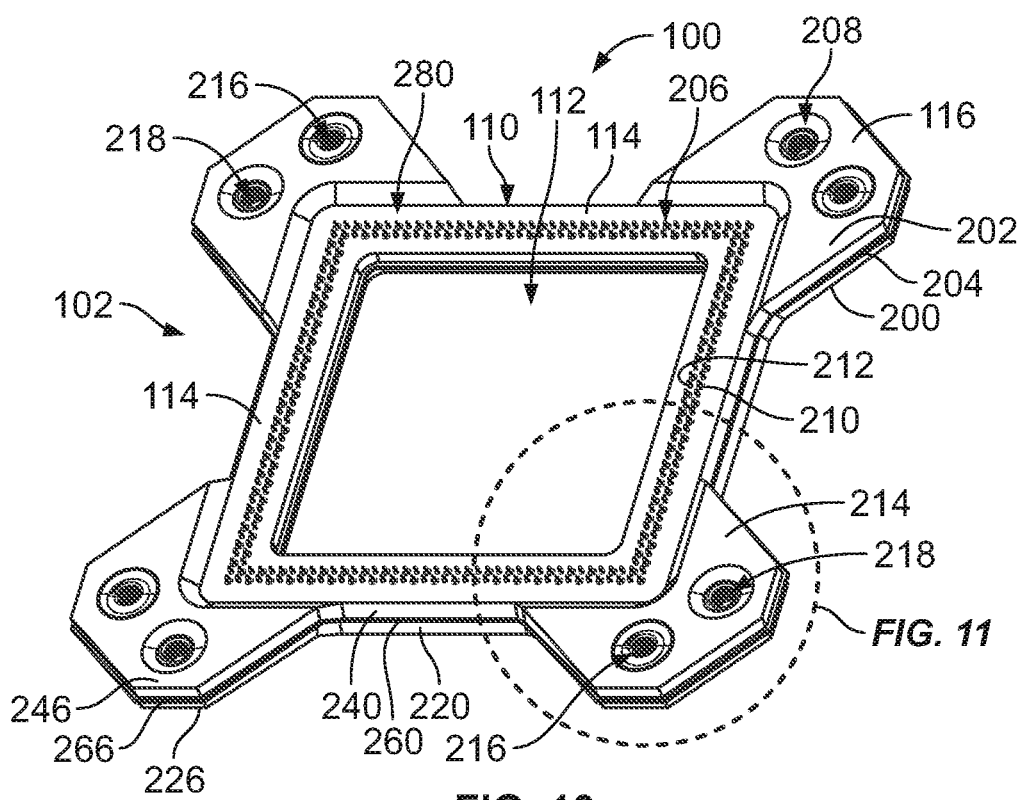
FIG. 10 is a bottom perspective view of the power delivery module in accordance with an exemplary embodiment.
Figure 11:
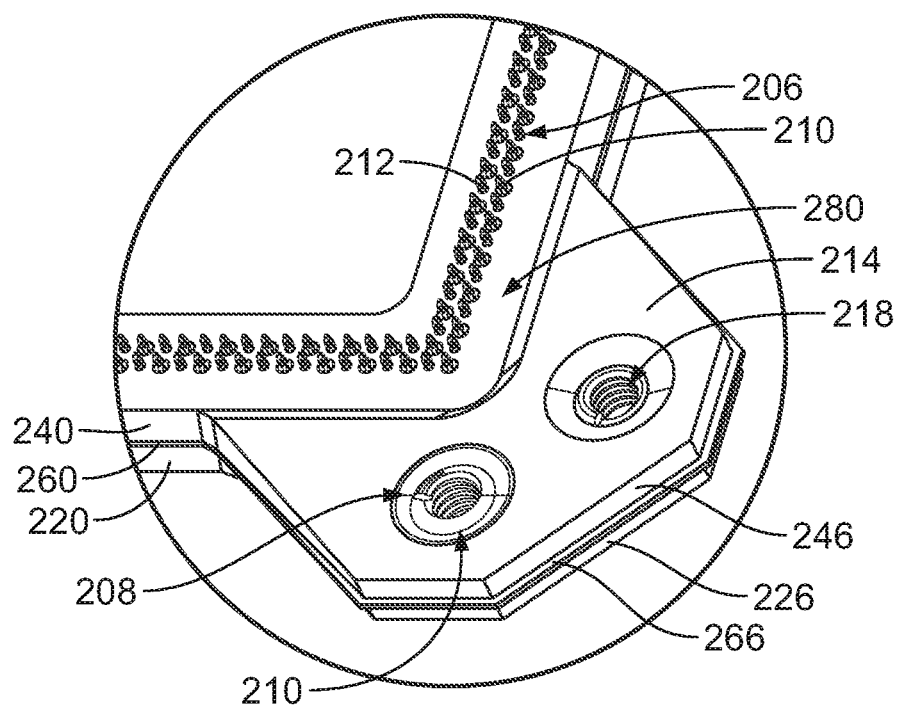
FIG. 11 is an enlarged view of a portion of the power delivery module shown in FIG. 10 in accordance with an exemplary embodiment.

FIG. 8 is a top perspective view of the power delivery module 102 in accordance with an exemplary embodiment. FIG. 9 is an enlarged view of a portion of the power delivery module 102 in accordance with an exemplary embodiment. FIG. 10 is a bottom perspective view of the power delivery module 102 in accordance with an exemplary embodiment. FIG. 11 is an enlarged view of a portion of the power delivery module 102 in accordance with an exemplary embodiment.

When assembled, the power plate 200, the ground plate 202, and the insulator 204 are stacked together with the insulator 204 between the power plate 200 and the ground plate 202. The walls 220, 240, 260 are aligned to form the rails 114 surrounding the opening 112. The pad members 226, 246, 266 are aligned to form the mounting pads 116. The threaded inserts 216, 218 are received in the bores of the mounting pads 116 to define the module terminals 208 forming part of the power circuit of the communication system 100. The threaded inserts 216, 218 may be press-fit into the mounting pads 116 or secured by other means, such as a threaded connection to the mounting pads 116. The threaded inserts 216 are electrically connected to the power plate 200 while the threaded inserts 218 are electrically connected to the ground plate 202. The insulator 204 electrically insulates the threaded inserts 216 from the ground plate 202 and electrically insulates the threaded inserts 218 from the power plate 200.

The module contacts 206 (shown in FIGS. 10 and 11) are electrically connected to the frame 110. In an exemplary embodiment, the module contacts 206 are press-fit into the rails 114. The module power contacts 210 are electrically connected to the power plate 200 and the module ground contacts 212 are electrically connected to the ground plate 202. Ends of the module contacts 206 extend from the bottom 214 of the frame 110 for electrical connection to the electronic package 104 (shown in FIG. 1). In an exemplary embodiment, the frame 110 includes a pocket 280 at the bottom 214 of the frame 110. The pocket 280 is sized and shaped to receive the electronic package 104. The ends of the module contacts 206 extend into the pocket 280 for electrical connection to the electronic package 104. In an exemplary embodiment, the mounting pads 116 are stamped downward relative to the rails 114 to form a pocket 280. The mounting pads 116 are configured be mounted to the host circuit board 106 (shown in FIG. 1) and hold the rails 114 elevated or spaced apart from the host circuit board 106 forming the pocket 280 that receives the electronic package 104.

Figure 12:
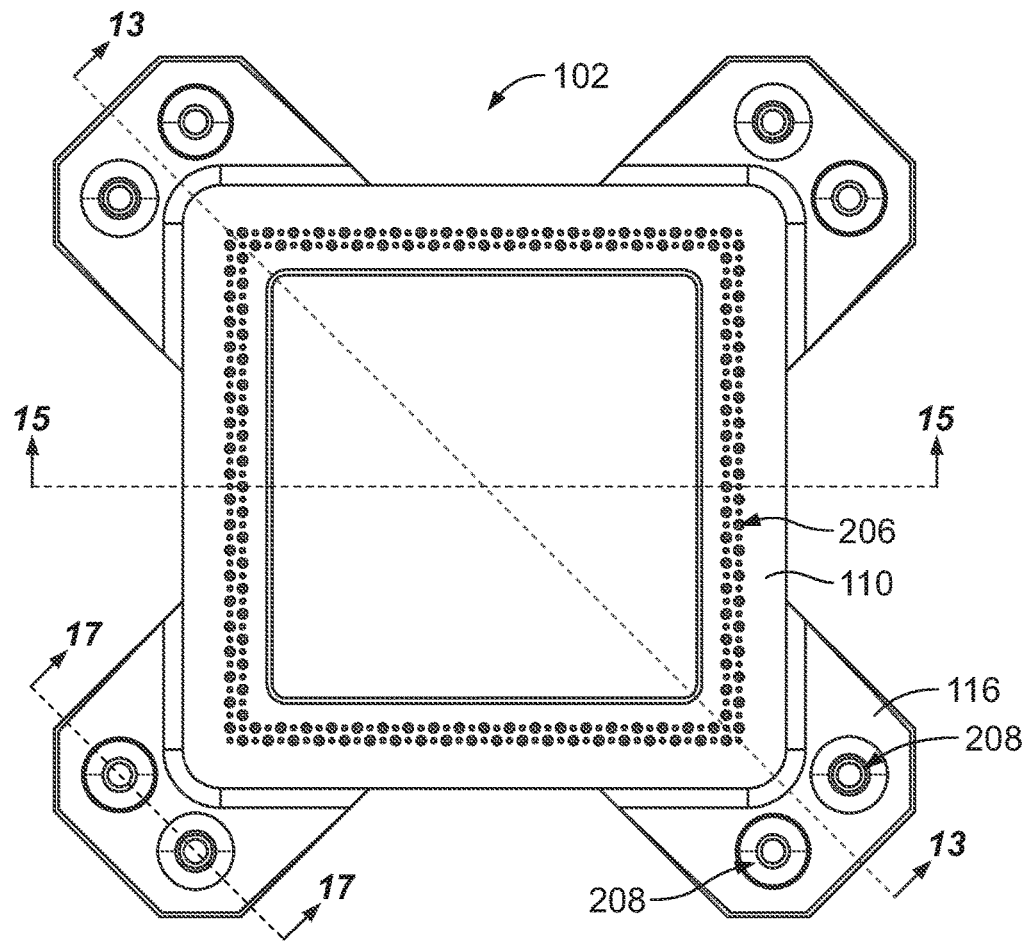
FIG. 12 is a top view of the power delivery module in accordance with an exemplary embodiment.

FIG. 12 is a top view of the power delivery module 102 in accordance with an exemplary embodiment. FIG. 12 shows the module terminals 208 in the mounting pads 116 and the module contacts 206 in the frame 110.

Figure 13:
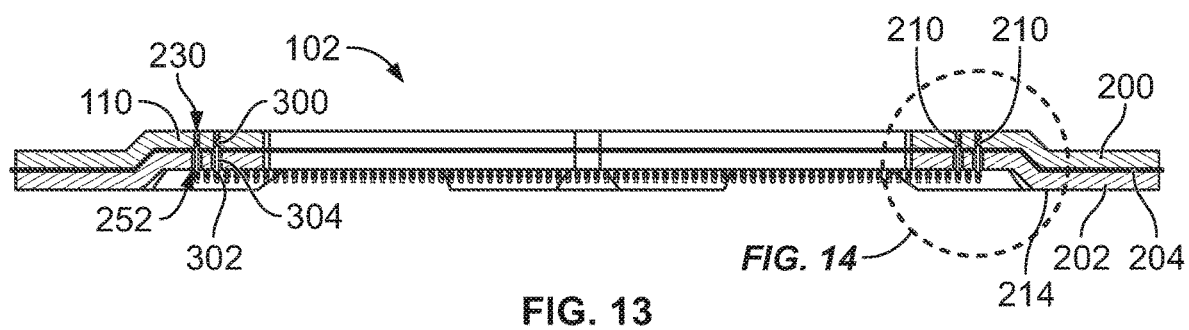
FIG. 13 is a cross-sectional view of the power delivery module in accordance with an exemplary embodiment taken along line 13-13 shown in FIG. 12.
Figure 14:
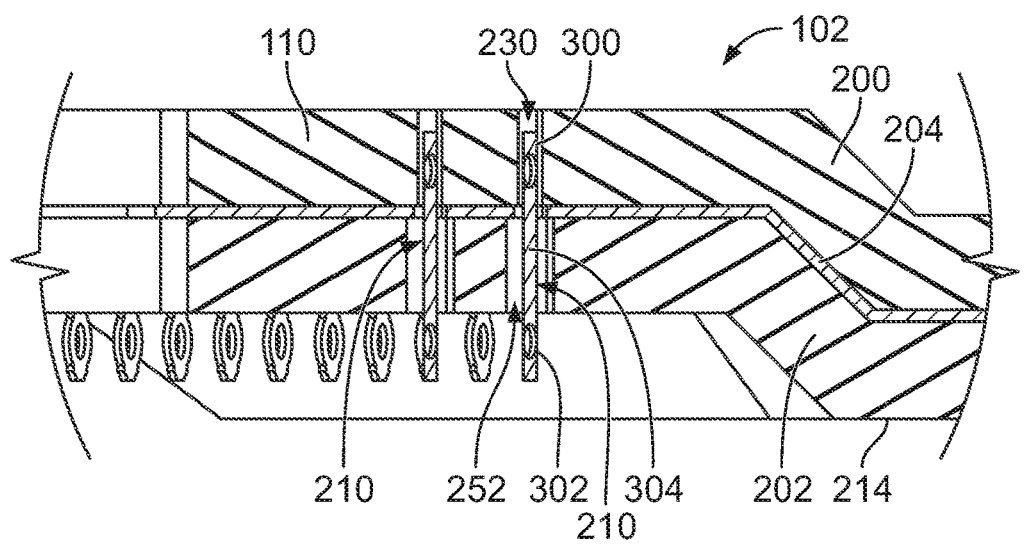
FIG. 14 is a cross-sectional view of a portion of the power delivery module shown in FIG. 13 in accordance with an exemplary embodiment.

FIG. 13 is a cross-sectional view of the power delivery module 102 in accordance with an exemplary embodiment taken along line 13-13 shown in FIG. 12. FIG. 14 is a cross-sectional view of a portion of the power delivery module 102 in accordance with an exemplary embodiment. FIGS. 13 and 14 illustrate the module power contacts 210 coupled to the power plate 200.

The module power contact 210 includes an upper pin 300 electrically connected to the power plate 200 and a lower pin 302 extending from the bottom 214 of the frame 110 for electrical connection to the electronic package 104 (shown in FIG. 3). In the illustrated embodiment, the upper pin 300 is a compliant pin, such as an eye-of-the-needle pin. The upper pin 300 is configured to be press-fit in the connecting through hole 230 of the power plate 200. A main body 304 of the module power contact 210 extends between the upper pin 300 and the lower pin 302. In the illustrated embodiment, the main body 304 passes through the insulator 204 and through the ground plate 202 to position the lower pin 302 below the bottom 214 of the frame 110. The main body 304 passes through the non-connecting through hole 252 of the ground plate 202. The main body 304 is electrically isolated from the ground plate 202. For example, the non-connecting through hole 252 may be oversized relative to the main body 304 (for example, have a larger diameter than the main body 304). The main body 304 may be separated from the ground plate 202 by air. In other various embodiments, the non-connecting through hole 252 may be filled with or lined with a dielectric material to electrically isolate the module power contact 210 from the ground plate 202. In the illustrated embodiment, the lower pin 302 is a compliant pin, such as an eye of the needle pin. The lower pin 302 is configured to be press-fit in the corresponding package power contact 154 (shown in FIG. 3) of the electronic package 104.

Figure 15:
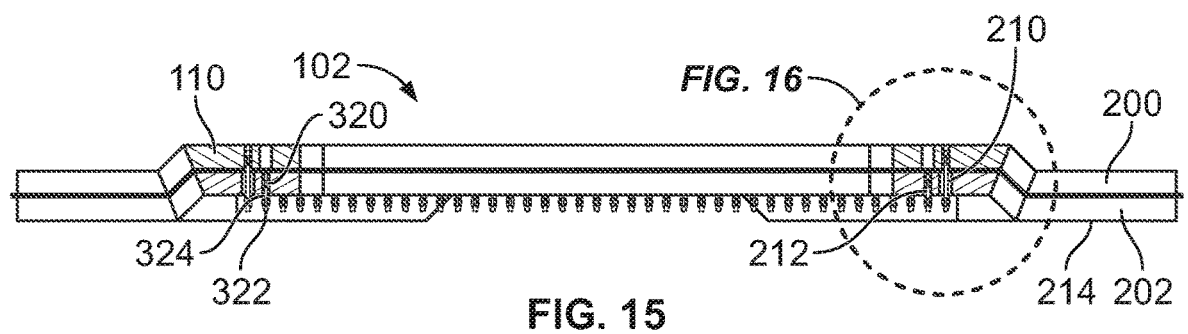
FIG. 15 is a cross-sectional view of the power delivery module in accordance with an exemplary embodiment taken along line 15-15 shown in FIG. 12.
Figure 16:
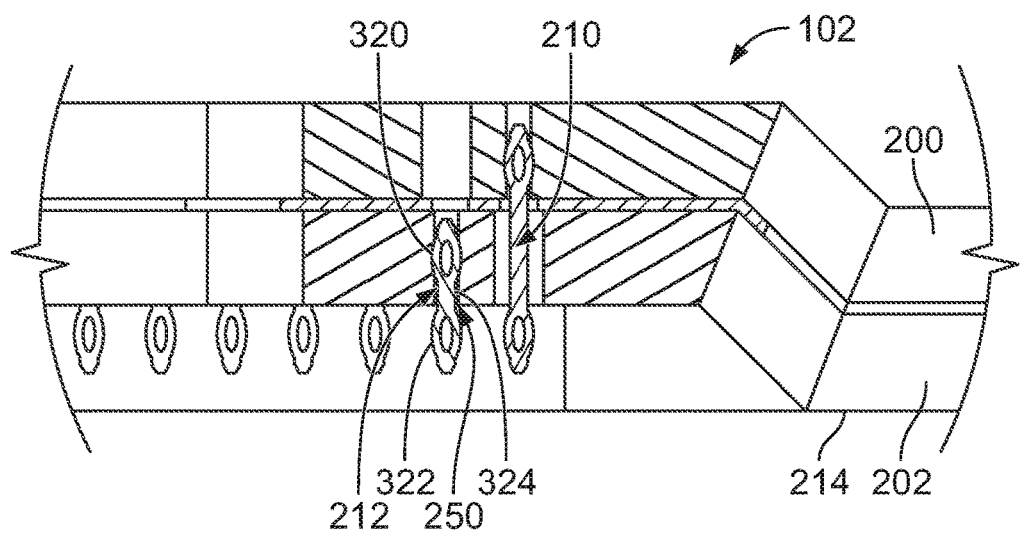
FIG. 16 is a cross-sectional view of a portion of the power delivery module shown in FIG. 15 in accordance with an exemplary embodiment.

FIG. 15 is a cross-sectional view of the power delivery module 102 in accordance with an exemplary embodiment taken along line 15-15 shown in FIG. 13. FIG. 16 is a cross-sectional view of a portion of the power delivery module 102 in accordance with an exemplary embodiment. FIGS. 15 and 16 illustrate the module power contacts 210 coupled to the power plate 200 and the module ground contacts 212 coupled to the ground plate 202.

Each module ground contact 212 includes an upper pin 320 electrically connected to the ground plate 202 and a lower pin 322 extending from the bottom 214 of the frame 110 for electrical connection to the electronic package 104 (shown in FIG. 3). In the illustrated embodiment, the upper pin 320 is a compliant pin, such as an eye-of-the-needle pin. The upper pin 320 is configured to be press-fit in the connecting through hole 250 of the ground plate 202. A main body 324 of the module ground contact 212 extends between the upper pin 320 and the lower pin 322. The module ground contact 212 is electrically isolated from the power plate 200. In the illustrated embodiment, the lower pin 322 is a compliant pin, such as an eye-of-the-needle pin. The lower pin 322 is configured to be press-fit in the corresponding package ground contact 156 (shown in FIG. 3) of the electronic package 104.

Figure 17:
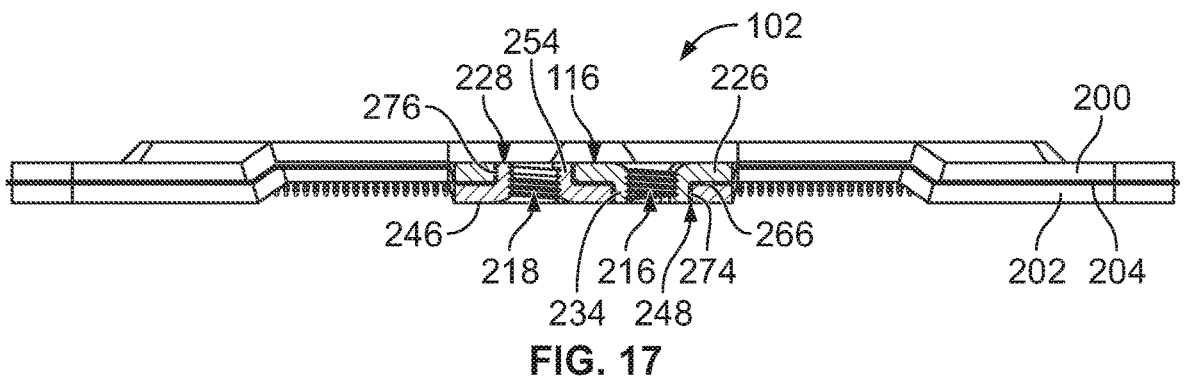
FIG. 17 is a cross-sectional view of the power delivery module in accordance with an exemplary embodiment.

FIG. 17 is a cross-sectional view of the power delivery module 102 in accordance with an exemplary embodiment taken along line 17-17 shown in FIG. 12. FIG. 17 illustrates the mounting pad 116 showing the pad member 266 of the insulator 204 between the pad members 226, 246 of the power plate 200 and the ground plate 202, respectively.

In an exemplary embodiment, the pad member 226 of the power plate 200 includes an extension 234 extending downward therefrom forming part of the bore 228. The threaded insert 216 is received in the bore 228 along the extension 234 and the bore 228. The extension 234 is received in the bore 248 of the pad member 246 of the ground plate 202. The separating wall 274 of the insulator 204 is located between the extension 234 and the ground plate 202 to electrically isolate the power plate 200 from the ground plate 202. Optionally, the bottom edge of the extension 234 may be coplanar with the bottom of the pad member 246 of the ground plate 202.

In an exemplary embodiment, the pad member 246 of the ground plate 202 includes an extension 254 extending upward therefrom forming part of the bore 248. The threaded insert 218 is received in the bore 248 along the extension 254 and the bore 248. The extension 254 is received in the bore 228 of the pad member 226 of the power plate 200. The separating wall 276 of the insulator 204 is located between the extension 254 and the power plate 200 to electrically isolate the power plate 200 from the ground plate 202. Optionally, a top edge of the extension 234 may be coplanar with the top of the pad member 226 of the power plate 200.

Figure 18:
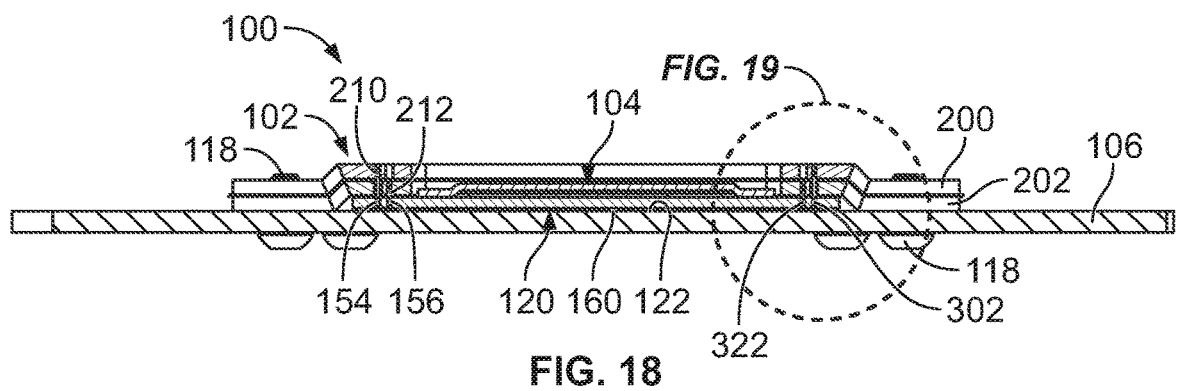
FIG. 18 is a cross-sectional view of the communication system in accordance with an exemplary embodiment taken along line 18-18 shown in FIG. 12.
Figure 19:
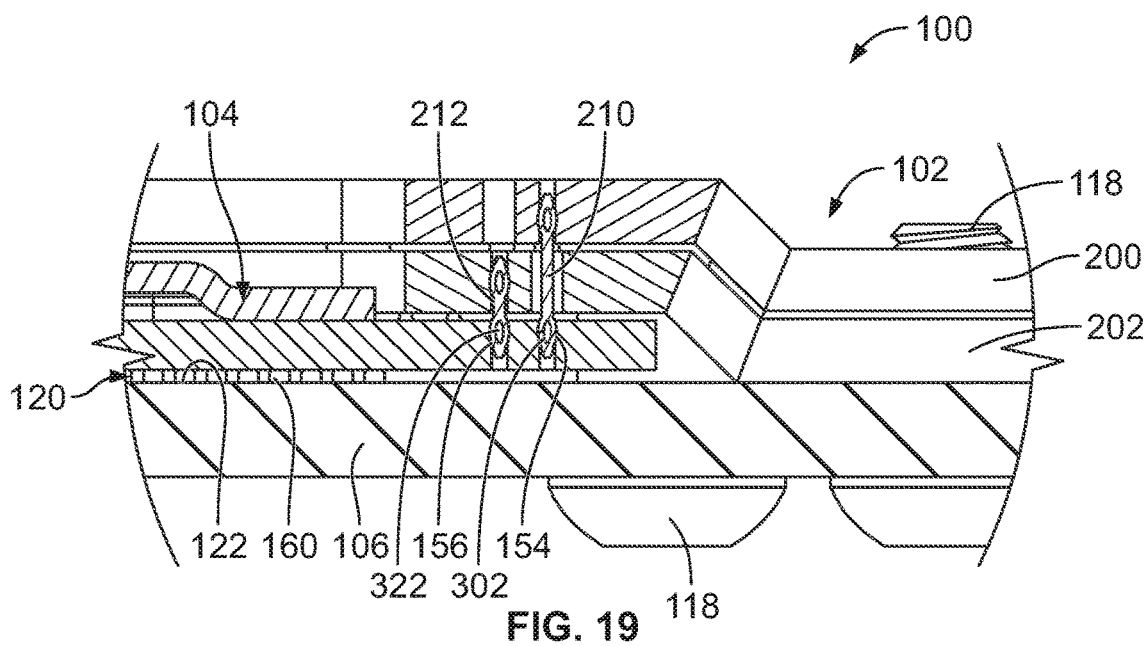
FIG. 19 is a cross-sectional view of a portion of the communication system shown in FIG. 18 in accordance with an exemplary embodiment.

FIG. 18 is a cross-sectional view of the communication system 100 in accordance with an exemplary embodiment. FIG. 19 is a cross-sectional view of a portion of the communication system 100 in accordance with an exemplary embodiment. FIGS. 18 and 19 illustrate the power delivery module 102 and the electronic package 104 mounted to the host circuit board 106. The power delivery module 102 is electrically connected to the electronic package 104 to deliver power to the electronic package 104.

During assembly, the electronic package 104 is electrically connected to the host circuit board 106. The package contacts 160 are electrically connected to the host circuit board contacts 122. For example, in various embodiments, the package contacts 160 may include solder balls soldered to the host circuit board contacts 122. During assembly, the power delivery module 102 is mounted to the host circuit board 106. The fasteners 118 mechanically and electrically connect the power delivery module 102 to the host circuit board 106. During assembly, the module power contacts 210 and the module ground contacts 212 are electrically connected to the package power contacts 154 and the package ground contacts 156, respectively. In an exemplary embodiment, the lower pins 302, 322 are press-fit into the plated vias defining the package contacts 154, 156. The electronic package 104 is electrically connected to the power plate 200 by the module power contacts 210 and the electronic package 104 is electrically connected to the ground plate 202 by the module ground contacts 212. A power circuit is formed between the host circuit board and the electronic package 104 through the power delivery module 102.

In an exemplary embodiment, the interface between the electronic package 104 and the host circuit board 106 at the mounting area 120 is devoid of power contacts. Rather, power is supplied to the electronic package 104 through the power delivery module 102. The bottom side of the electronic package 104 is a signal interface with the host circuit board 106, whereas the top side of the electronic package 104 is a power interface with the power delivery module 102. Eliminating power contacts in the mounting area 120 allows for tighter spacing and/or increased density of signal contacts in the mounting area 120, which may allow for a greater number of signal contacts within the mounting area 120 per unit length or may allow for connection of a smaller electronic package 104, thus reducing the size and/or the cost of the communication system 100. Eliminating power contacts in the mounting area 120 allows for more efficient signal routing of the signal contacts within the host circuit board 106 and through the electronic package 104, thus shortening signal paths within the communication system 100, thereby improving signal integrity.

Figure 20:
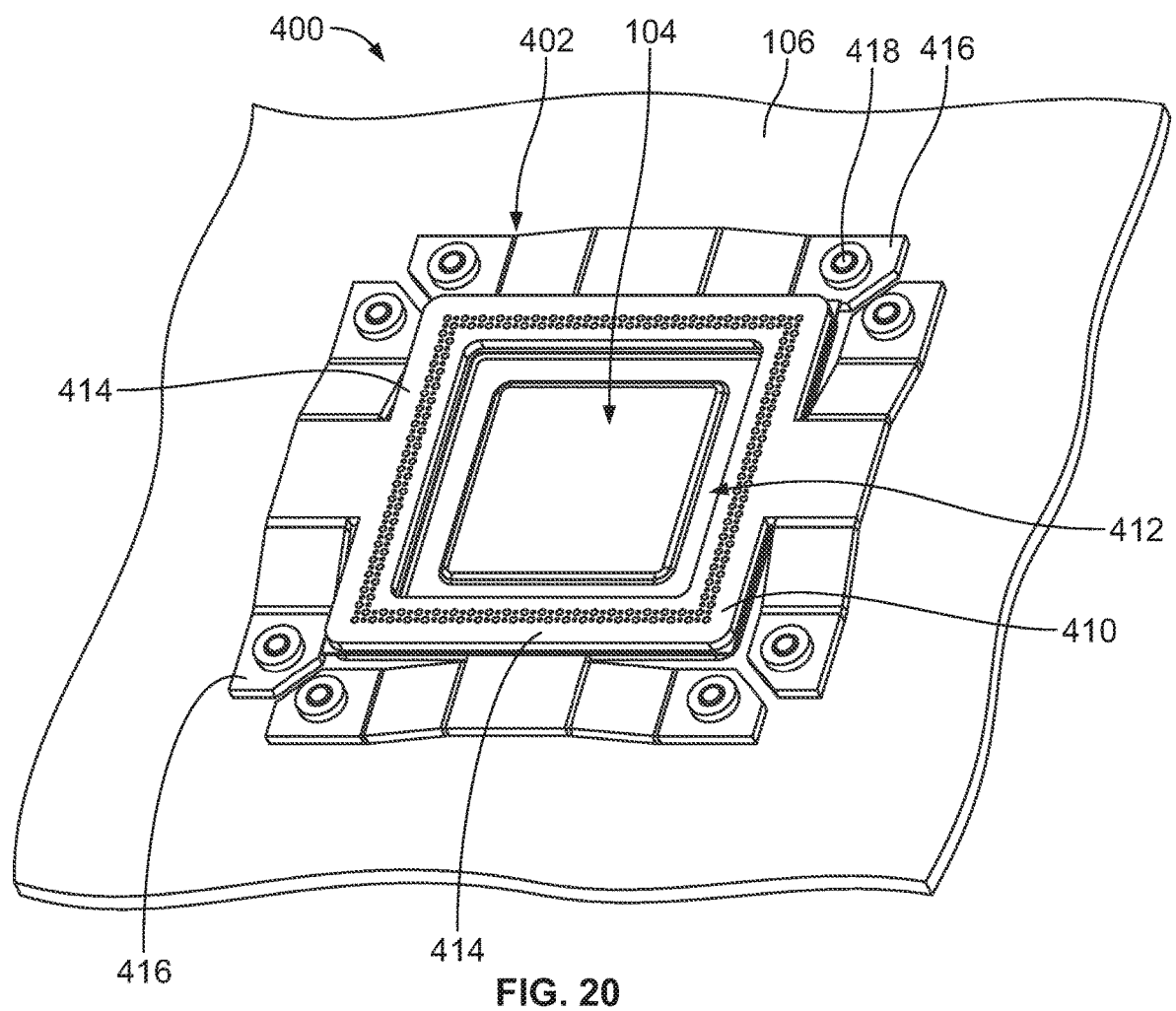
FIG. 20 is a top perspective view of a communication system having a power delivery module in accordance with an exemplary embodiment.

FIG. 20 is a top perspective view of a communication system 400 having a power delivery module 402 in accordance with an exemplary embodiment. The power delivery module 402 is used to supply power to the electronic package 104. The power delivery module 402 is similar to the power delivery module 102 (shown in FIG. 1); however, the power delivery module 402 includes deflectable mounting pads 416 configured to be mounted to the host circuit board 106 rather than the rigid mounting pads 116 (shown in FIG. 1). The power delivery module 402 is electrically connected to the host circuit board 106 and receives a power supply from the host circuit board 106 through the deflectable mounting pads 416. The power delivery module 402 is configured to be electrically connected to the electronic package 104 and configured to deliver the power supply to the electronic package 104 in a similar manner as the power delivery module 102.

In an exemplary embodiment, the power delivery module 402 includes a frame 410 having an opening 412 that receives a portion of the electronic package 104 and/or a heat sink. The frame 410 includes rails 414 defining a perimeter around the opening 412. The frame 410 includes the mounting pads 416 configured to be mounted to the host circuit board 106. In the illustrated embodiment, the mounting pads 416 are deflectable and configured to be compressed against the top surface of the host circuit board 106. In an exemplary embodiment, the mounting pads 416 are mechanically and electrically connected to the host circuit board 106 using fasteners 418, such as threaded fasteners.

Figure 21:
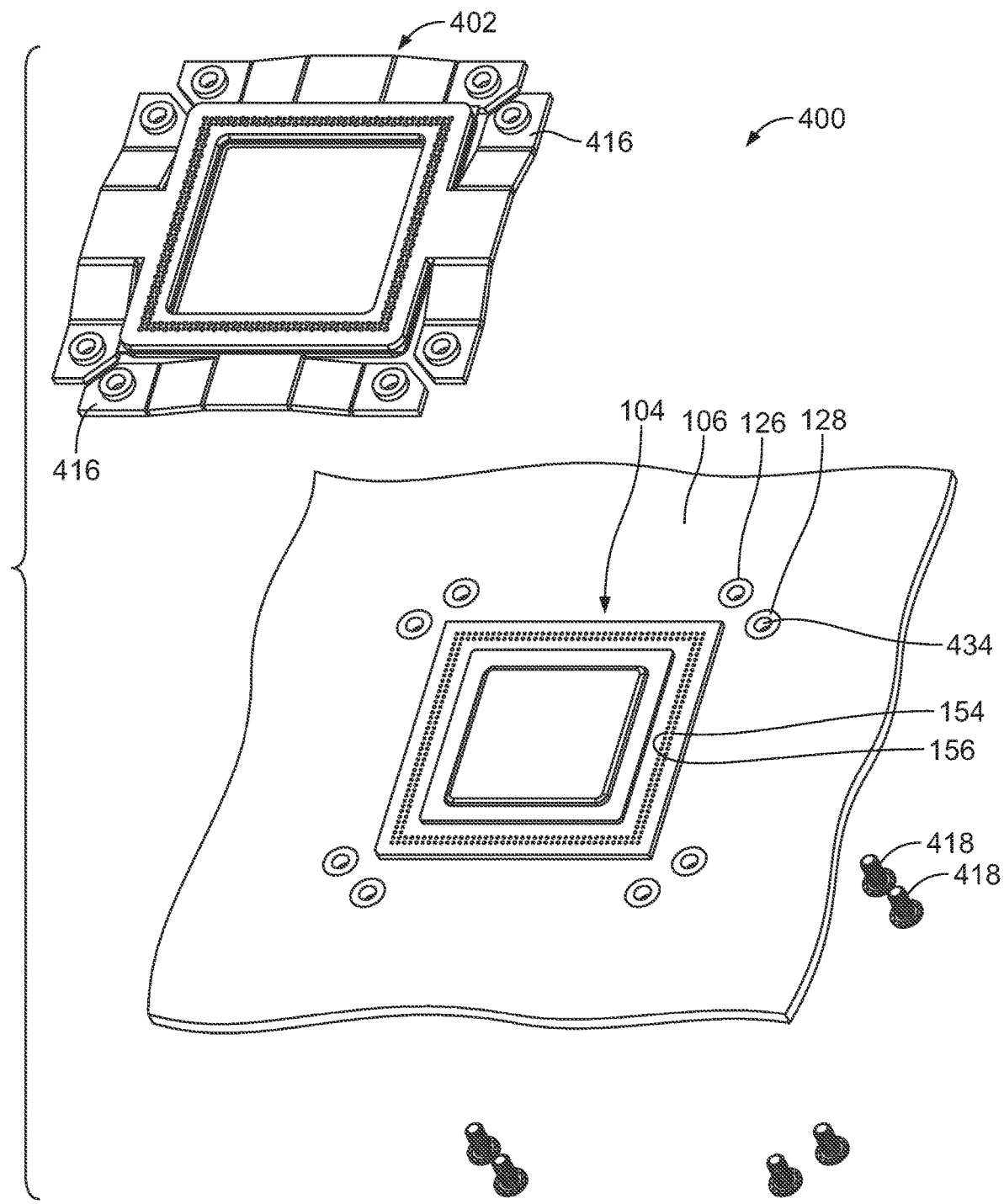
FIG. 21 is an exploded, top perspective view of the communication system shown in FIG. 20 in accordance with an exemplary embodiment.

FIG. 21 is an exploded, top perspective view of the communication system 400 in accordance with an exemplary embodiment showing the power delivery module 402 poised for mounting to the electronic package 104 and the host circuit board 106. During assembly, the power delivery module 402 is aligned with the electronic package 104 and lowered into position over the top side of the electronic package 104 when mounting the power delivery module 402 to the host circuit board 106. The mounting pads 416 are aligned with the host terminals 126, 128 of the host circuit board 106. The fasteners 418 are used to mechanically and electrically connect the mounting pads 416 to the host circuit board 106 using threaded inserts 434. Power is supplied to the power delivery module 402 through the host terminals 126, 128. The power delivery module 402 is electrically connected to the package contacts 154, 156 to deliver power to the electronic package 104.

In an exemplary embodiment, the interface between the electronic package 104 and the host circuit board 106 is devoid of power contacts. Rather, power is supplied to the electronic package 104 through the power delivery module 402. The bottom side of the electronic package 104 is a signal interface with the host circuit board 106, whereas the top side of the electronic package 104 is a power interface with the power delivery module 402. Eliminating power contacts at the interface between the electronic package 104 and the host circuit board 106 allows for tighter spacing and/or increased density of signal contacts in the mounting area, which may allow for a greater number of signal contacts within the mounting area per unit length or may allow for connection of a smaller electronic package 104, thus reducing the size and/or the cost of the communication system 400. Eliminating power contacts in the mounting area allows for more efficient signal routing of the signal contacts within the host circuit board 106 and through the electronic package 104, thus shortening signal paths within the communication system 400, thereby improving signal integrity.

Figure 22:
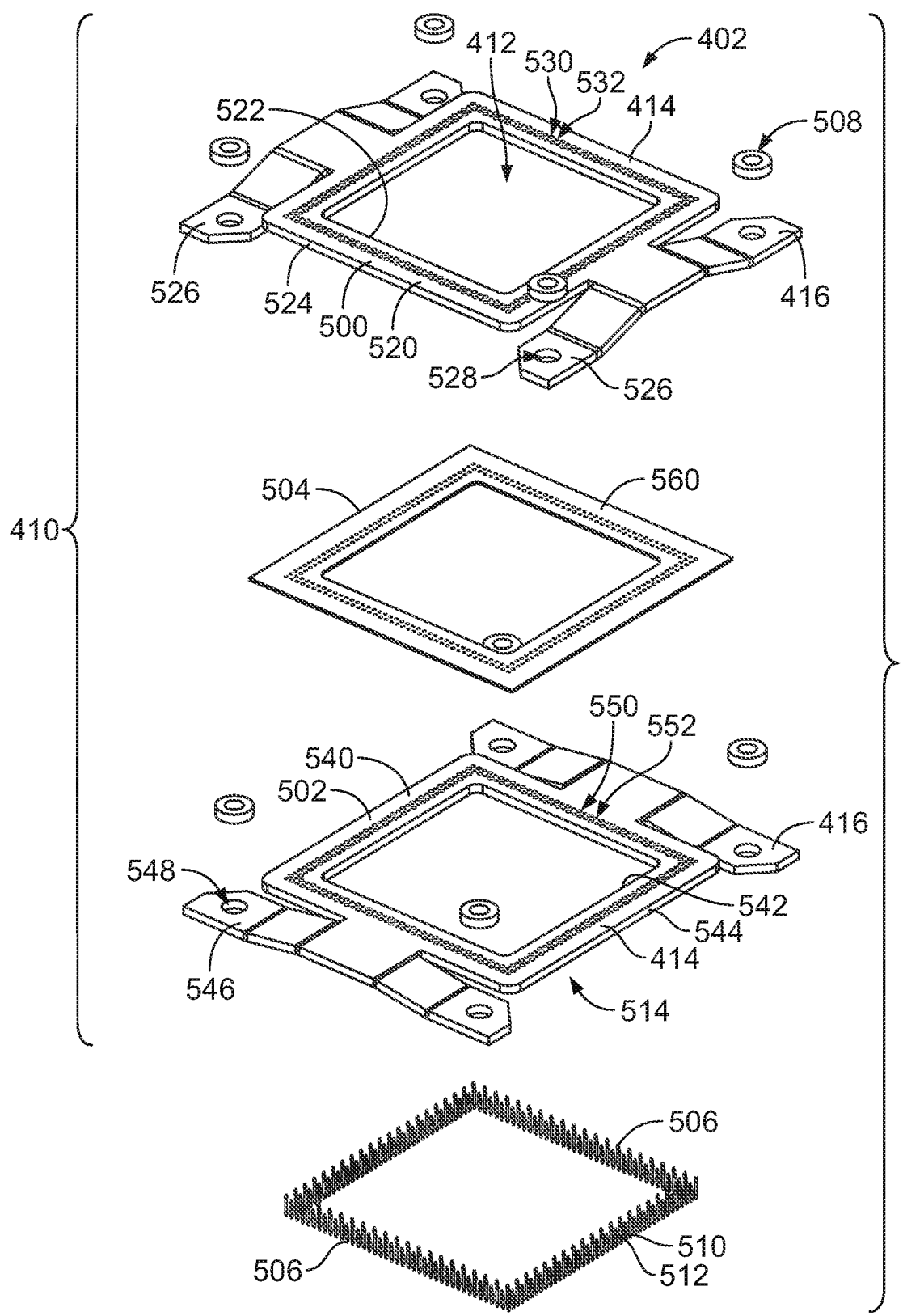
FIG. 22 is an exploded, top perspective view of the power delivery module shown in FIG. 20 in accordance with an exemplary embodiment.

FIG. 22 is an exploded, top perspective view of the power delivery module 402 in accordance with an exemplary embodiment. In an exemplary embodiment, the frame 410 is a layered structure including a power plate 500 at a power layer, a ground plate 502 at a ground layer, and an insulator 504 at in insulation layer between the power layer and the ground layer. The insulator 504 electrically isolates the power plate 500 from the ground plate 502. In the illustrated embodiment, the power plate 500 is the top layer and the ground plate 502 is the bottom layer; however, the power plate 500 may be the bottom layer and the ground plate 502 may be the top layer in alternative embodiments.

The power delivery module 402 includes an array of module contacts 506 configured to be electrically connected to the electronic package 104 (shown in FIG. 21) and an array of module terminals 508 configured to be electrically connected to the host circuit board 106 (shown in FIG. 21). The module terminals 508 are coupled to corresponding mounting pads 416. The fasteners 418 mechanically and electrically connect the mounting pads 416 to the host terminals 126, 128 (shown in FIG. 21) of the host circuit board 106. The module contacts 506 and the module terminals 508 are electrically connected to the frame 410 (shown in FIG. 20), such as to the power plate 500 and the ground plate 502. The frame 410 defines a power bus to electrically connect the module contacts 506 and the module terminals 508.

In an exemplary embodiment, the module contacts 506 include module power contacts 510 and module ground contacts 512. The module power contacts 510 are electrically connected to the power plate 500 and the module ground contacts 512 are electrically connected to the ground plate 502. In an exemplary embodiment, the module power contacts 510 and the module ground contacts 512 are coupled to the rails 414 surrounding the opening 412 and extend from a bottom 514 of the frame 410 for electrical connection to corresponding package power contacts 154 and package ground contacts 156 (both shown in FIG. 21) of the electronic package 104. The module power contacts 510 and the module ground contacts 512 deliver power to the electronic package 104.

The power plate 500 may be a generally planar structure having walls 520 forming portions of the rails 414. In various embodiments, the power plate 500 is a metal plate, such as being stamped and formed, or milled or otherwise fabricated from a metal material. In other various embodiments, the power plate 500 may be a circuit board having a conductive layer forming part of the power circuit. The walls 520 surround the opening 412. Each wall 520 includes an inner edge 522 and an outer edge 524. The inner edge 522 faces the opening 412. The outer edge 524 defines an outer perimeter of the power plate 500. The power plate 500 includes pad members 526 defining portions of the mounting pads 416. In an exemplary embodiment, the pad members 526 are deflectable. The pad members 526 include bores 528 through the pad members 526. The bores 528 receive corresponding module terminals 508, such as threaded inserts.

The walls 520 include connecting through holes 530 and non-connecting through holes 532. The connecting through holes 530 define power through holes and receive corresponding module power contacts 510. The module power contacts 510 are connected to the power plate 500 at the corresponding connecting through hole 530. The non-connecting through holes 532 define ground through holes and receive corresponding module ground contacts 512. The module ground contacts 512 are electrically isolated from the power plate 500 and do not engage the power plate 500 in the non-connecting through holes 532.

The ground plate 502 may be a generally planar structure having walls 540 forming portions of the rails 414. In various embodiments, the ground plate 502 is a metal plate, such as being stamped and formed, or milled or otherwise fabricated from a metal material. In other various embodiments, the ground plate 502 may be a circuit board having a conductive layer forming part of the power circuit. The walls 540 are configured to be aligned with the walls 520 to from the rails 414. The walls 540 surround the opening 412. Each wall 540 includes an inner edge 542 and an outer edge 544. The inner edge 542 faces the opening 412. The outer edge 544 defines an outer perimeter of the ground plate 502. The ground plate 502 includes pad members 546 defining portions of the mounting pads 416. In an exemplary embodiment, the pad members 546 are deflectable. The pad members 546 include bores 548 through the pad members 546 that receive corresponding module terminals 508, such as threaded inserts.

The walls 540 include connecting through holes 550 and non-connecting through holes 552. The connecting through holes 550 define ground through holes and receive corresponding module ground contacts 512. The module ground contacts 512 are connected to the ground plate 502 at the corresponding connecting through hole 550. The non-connecting through holes 552 define power through holes and receive corresponding module power contacts 510. The module power contacts 510 are electrically isolated from the ground plate 502 and do not engage the ground plate 502 in the non-connecting through holes 552.

The insulator 504 may be a generally planar structure having areas 560 forming portions of the rails 414. The insulator 504 may be a very thin insulating material conforming to the power plate 500 and the ground plate 502. In various embodiments, the insulator 504 is a dielectric plate or film, such as being fabricated from a plastic or other insulative material. In various embodiments, the insulator 504 may be fabricated from a dielectric material intended to increase the capacitance of the power delivery module 402, thus improving the electrical performance by lowering the inductance.

Figure 23:
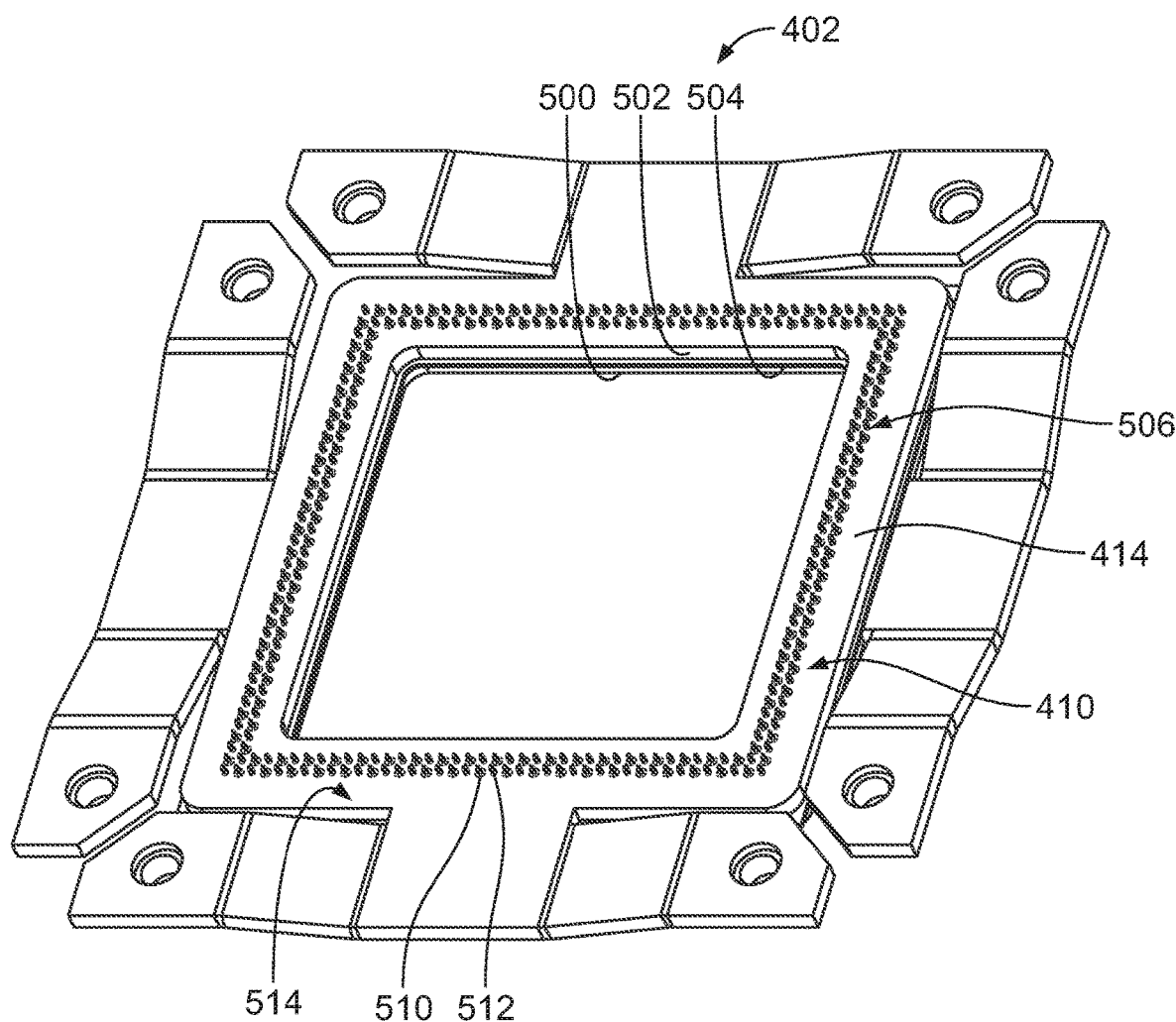
FIG. 23 is a bottom perspective view of the power delivery module shown in FIG. 20 in accordance with an exemplary embodiment.

FIG. 23 is a bottom perspective view of the power delivery module 402 in accordance with an exemplary embodiment. When assembled, the power plate 500, the ground plate 502, and the insulator 504 are stacked together with the insulator 504 between the power plate 500 and the ground plate 502. The module contacts 506 are electrically connected to the frame 410, such as being press-fit into the rails 414. For example, the module power contacts 510 are electrically connected to the power plate 500 and the module ground contacts 512 are electrically connected to the ground plate 502. Ends of the module contacts 506 extend from the bottom 514 of the frame 410 for electrical connection to the electronic package 104 (shown in FIG. 21).

Figure 24:
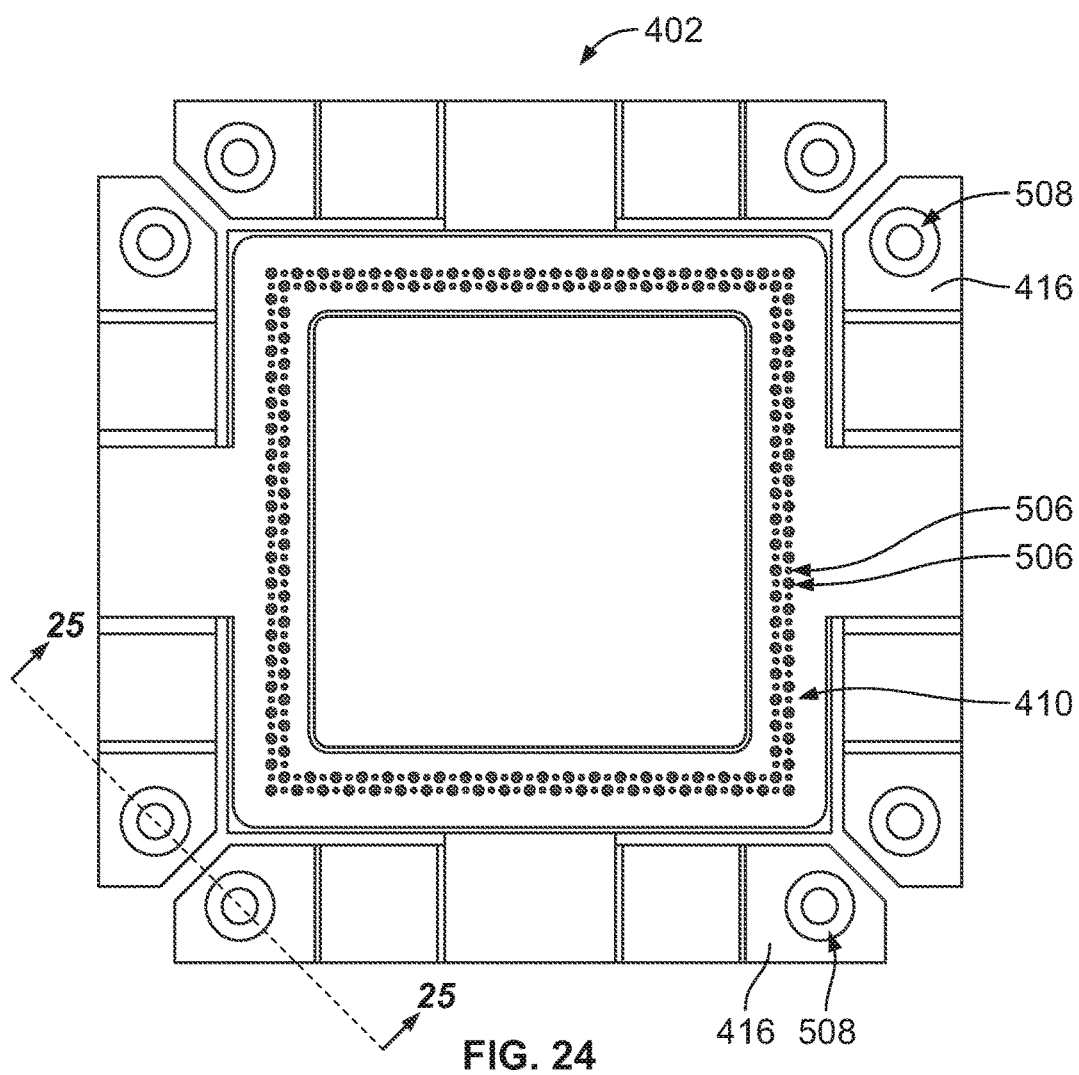
FIG. 24 is a top view of the power delivery module shown in FIG. 20 in accordance with an exemplary embodiment.

FIG. 24 is a top view of the power delivery module 402 in accordance with an exemplary embodiment. FIG. 24 shows the module terminals 508 in the mounting pads 416. FIG. 24 shows the module contacts 506 in the frame 410.

Figure 25:
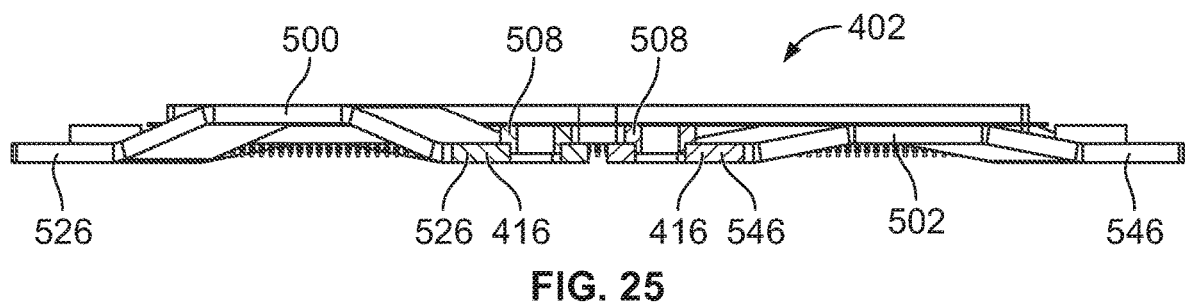
FIG. 25 is a cross-sectional view of the power delivery module shown in FIG. 20 in accordance with an exemplary embodiment taken along line 25-25 shown in FIG. 24.

FIG. 25 is a cross-sectional view of the power delivery module 402 in accordance with an exemplary embodiment taken along line 25-25 shown in FIG. 24. FIG. 25 illustrates the mounting pads 416 showing the pad member 526 of the power plate 500 and the pad member 546 of the ground plate 502. The pad members 526, 546 are coplanar and configured to be mounted to the host circuit board 106 (shown in FIG. 20). The pad members 526, 546 are configured to be compressed against the host circuit board 106 when the fasteners 418 (shown in FIG. 20) are coupled to the module terminals 508. The mounting pads 416 are deflectable.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A power delivery module comprising:
a frame having a top and a bottom, the frame having rails defining an opening configured to receive an electronic package, the bottom configured to be mounted to a host circuit board, the bottom facing an upper surface of the electronic package with the electronic package between the bottom of the frame and the host circuit board, the frame being a layered structure including a power plate at a power layer, a ground plate at a ground layer, and an insulator at in insulation layer between the power layer and the ground layer, the insulator electrically isolating the power plate from the ground plate, wherein the power plate is separate from the insulator and the ground plate is separate from the insulator and assembled by stacking together the power plate, the ground plate and the insulator with the insulator between the power plate and the ground plate;

module power contacts electrically connected to the power plate, the module power contacts coupled to the rails surrounding the opening and extending from the bottom for electrical connection to package power contacts of the electronic package; and module ground contacts electrically connected to the ground plate, the module ground contacts coupled to the rails surrounding the opening and extending from the bottom for electrical connection to package ground contacts of the electronic package;

wherein the module power contacts and the module ground contacts deliver power to the electronic package.

2. The power delivery module of claim 1, wherein the module power contacts and the module ground contacts are coupled to each of the rails to surround the opening.

3. The power delivery module of claim 1, wherein the module power contacts and the module ground contacts surround a perimeter of the opening to connect to the package power contacts and the package ground contacts around a perimeter of the electronic package.

4. The power delivery module of claim 1, wherein each module power contact includes an upper pin electrically connected to the power plate and a lower pin extending from the bottom of the frame for electrical connection to the corresponding package power contact, and wherein each module ground contact includes an upper pin electrically connected to the ground plate and a lower pin extending from the bottom of the frame for electrical connection to the corresponding package ground contact.

5. The power delivery module of claim 4, wherein the upper pins of the module power contacts are compliant pins being press-fit into the power plate and the lower pins of the module ground contacts are compliant pins being press-fit into the ground plate.

6. The power delivery module of claim 1, wherein the power plate includes through holes, the module power contacts being press-fit into corresponding through holes of the power plate, and wherein the ground plate includes through holes, the module ground contacts being press-fit into corresponding through holes of the ground plate.

7. The power delivery module of claim 1, wherein the frame includes a pocket at the bottom receiving the electronic package, the module power contacts extending from the bottom into the pocket, the module ground contacts extending from the bottom into the pocket.

8. The power delivery module of claim 1, wherein the module power contacts pass through the ground plate to connect to the power plate without being electrically connected to the ground plate.

9. The power delivery module of claim 1, wherein the frame includes at least one mounting pad for mounting the frame to the host circuit board, the at least one mounting pad including module terminals electrically connected to the host circuit board to receive a power supply from the host circuit board.

10. The power delivery module of claim 9, wherein the module terminals include threaded bores configured to be mechanically and electrically connected to the host circuit board using threaded fasteners.

11. The power delivery module of claim 1, wherein the power plate includes a mounting pad for mechanically and electrically connecting the power plate to the host circuit board to receive a power supply from the host circuit board, and wherein the ground plate includes a mounting pad for mechanically and electrically connecting the ground plate to the host circuit board to receive a power supply from the host circuit board.

12. The power delivery module of claim 11, wherein the mounting pad of the power plate is deflectable and configured to be compressed against the host circuit board and the mounting pad of the ground plate is deflectable and configured to be compressed against the host circuit board.

13. The power delivery module of claim 1, wherein the power plate is a stamped and formed plate and the ground plate is a stamped and formed plate stacked with the power plate forming a plate stack with the insulator therebetween.

14. The power delivery module of claim 1, wherein the power plate has a first thickness, the ground plate has a second thickness and the insulator has a third thickness, the third thickness being less than the first thickness and the second thickness.

15. A power delivery module comprising:
a frame having a top and a bottom, the frame having rails defining an opening configured to receive an electronic package, the frame including at least one mounting pad coupled to a host circuit board, the at least one mounting pad including module terminals electrically connected to the host circuit board to receive a power supply from the host circuit board, the bottom facing an upper surface of the electronic package with the electronic package between the bottom of the frame and the host circuit board, the frame being a layered structure including a power plate at a power layer, a ground plate at a ground layer, and insulator at an insulation layer between the power layer and the ground layer, the insulator electrically isolating the power plate from the ground plate, the power plate and the ground plate being electrically connected to corresponding module terminals for receiving the power supply;

module power contacts electrically connected to the power plate, the module power contacts coupled to the rails surrounding the opening and extending from the bottom for electrical connection to package power contacts of the electronic package; and module ground contacts electrically connected to the ground plate, the module ground contacts coupled to the rails surrounding the opening and extending from the bottom for electrical connection to package ground contacts of the electronic package;

wherein the module power contacts and the module ground contacts deliver the power supply to the electronic package.

16. The power delivery module of claim 15, wherein the module terminals include threaded bores configured to be mechanically and electrically connected to the host circuit board using threaded fasteners.

17. The power delivery module of claim 15, wherein each of the at least one mounting pad includes a first module terminal electrically connected to the power plate and a second module terminal electrically connected to the ground plate.

18. The power delivery module of claim 15, wherein the module power contacts and the module ground contacts surround a perimeter of the opening to connect to the package power contacts and the package ground contacts, around a perimeter of the electronic package.

19. The power delivery module of claim 15, wherein each module power contact includes an upper pin electrically connected to the power plate and a lower pin extending from the bottom of the frame for electrical connection to the corresponding package power contact, and wherein each module ground contact includes an upper pin electrically connected to the ground plate and a lower pin extending from the bottom of the frame for electrical connection to the corresponding package ground contact.

20. The power delivery module of claim 15, wherein the power plate includes through holes, the module power contacts being press-fit into corresponding through holes of the power plate, and wherein the ground plate includes through holes, the module ground contacts being press-fit into corresponding through holes of the ground plate.

21. The power delivery module of claim 15, wherein the frame includes a pocket at the bottom receiving the electronic package, the module power contacts extending from the bottom into the pocket, the module ground contacts extending from the bottom into the pocket.

22. The power delivery module of claim 15, wherein the at least one mounting pad is deflectable and configured to be compressed against the host circuit board for mechanically and electrically connecting the frame to the host circuit board to receive a power supply from the host circuit board.

23. A communication system comprising:
an electronic package including a package substrate having an upper surface and a lower surface, the lower surface configured to be mounted to a host circuit board, the package substrate having package signal contacts configured to be terminated to host circuit board signal conductors of the host circuit board, the package substrate having package power contacts configured to be terminated to host circuit board power conductors of the host circuit board, the package substrate having package ground contacts configured to be terminated to host circuit board ground conductors of the host circuit board, the electronic package including an integrated circuit component mounted to the upper surface of the package substrate, the integrated circuit component being electrically connected to the package signal contacts, the package power contacts and the package ground contacts; and
a power delivery module configured to be mounted to the host circuit board and being powered by the host circuit board, the power delivery module being coupled to the electronic package to deliver a power supply to the electronic package, the power delivery module comprising a frame, module power contacts coupled to the frame, and module ground contacts coupled to the frame, the frame having a top and a bottom, the frame having rails defining an opening receiving the integrated circuit component, the bottom configured to be mounted to the host circuit board, the bottom facing the upper surface of the package substrate with the package substrate between the bottom of the frame and the host circuit board, the frame being a layered structure including a power plate at a power layer, a ground plate at a ground layer, and an insulator at insulation layer between the power layer and the ground layer, the insulator electrically isolating the power plate from the ground plate, wherein the power plate is separate from the insulator and the ground plate is separate from the insulator and assembled by stacking together the power plate, the ground plate and the insulator with the insulator between the power plate and the ground plate, the module power contacts being electrically connected to the power plate, the module power contacts coupled to the rails surrounding the opening and extending from the bottom for electrical connection to corresponding package power contacts, the module ground contacts electrically connected to the ground plate, the module ground contacts coupled to the rails surrounding the opening and extending from the bottom for electrical connection to corresponding package ground contacts of the electronic package, wherein the module power contacts and the module ground contacts deliver the power supply to the electronic package.

24. The communication system of claim 23, wherein the package signal contacts are provided at the lower surface of the package substrate for termination to the host circuit board, the package power contacts being provided at the upper surface of the package substrate for receiving the corresponding module power contacts, the package ground contacts being provided at the upper surface of the package substrate for receiving the corresponding module ground contacts.

25. The communication system of claim 23, wherein the package power contacts comprise plated vias, the module power contacts being press-fit into the plated vias of the package power contacts, and wherein the package ground contacts comprise plated vias, the module ground contacts being press-fit into the plated vias of the package ground contacts.

* * * * *